(12) United States Patent
Katagami et al.

(10) Patent No.: US 7,182,815 B2
(45) Date of Patent: Feb. 27, 2007

(54) APPARATUS AND METHOD FOR PRODUCING COLOR FILTERS BY DISCHARGING MATERIAL

(75) Inventors: Satoru Katagami, Hara-mura (JP); Hisashi Aruga, Fujimi-machi (JP); Hiroshi Kiguchi, Suwa (JP); Tatsuya Ito, Matsumoto (JP); Tomomi Kawase, Nagano-ken (JP); Masaharu Shimizu, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/043,244

(22) Filed: Jan. 14, 2002

(65) Prior Publication Data

US 2002/0105688 A1    Aug. 8, 2002

(30) Foreign Application Priority Data

Jan. 15, 2001  (JP)  ............................. 2001-006634
Oct. 26, 2001  (JP)  ............................. 2001-329824

(51) Int. Cl.
*B05C 11/10* (2006.01)
*B41J 29/38* (2006.01)

(52) U.S. Cl. ...................... 118/665; 118/315; 118/323; 347/9; 347/12; 347/13; 347/42; 347/43

(58) Field of Classification Search .................. 347/9, 347/12, 13, 42, 43; 118/665, 315, 323
See application file for complete search history.

(56) References Cited

U.S. PATENT DOCUMENTS 6,109,727 A   8/2000  Akahira et al.
6,145,981 A * 11/2000 Akahira et al. ............. 347/107
6,180,049 B1 * 1/2001 Jang et al. ................... 264/401
6,290,352 B1 * 9/2001 Marumoto et al. ......... 347/106
6,394,578 B1   5/2002 Akahira et al.
6,565,206 B2   5/2003 Okabe et al.
6,630,274 B1  10/2003 Kiguchi et al.
6,758,550 B2 * 7/2004 Ito et al. ....................... 347/40
2001/0024227 A1 * 9/2001 Sekiya ......................... 347/101

FOREIGN PATENT DOCUMENTS

| EP | 0 832 745 A2 | 4/1998 |
| EP | 1 074 861 A2 | 2/2001 |
| JP | A-02-165962 | 6/1990 |
| JP | 06-344627 | 12/1994 |

(Continued)

*Primary Examiner*—George Koch
(74) *Attorney, Agent, or Firm*—Oliff & Berridge, PLC

(57) ABSTRACT

The present invention provides a system which shortens the scanning time with an ink jet head for forming a pattern of filter elements of a color filter, picture element pixels of an electroluminescence (EL) device, or the like. An apparatus for producing a color filter can include a plurality of filter elements arranged on a substrate. The apparatus can further include a plurality of heads each having a nozzle row having a plurality of nozzles arranged, an ink supply device for supplying a filter element material to the heads, a carriage supporting the heads arranged thereon, a main scanning driving device for moving the carriage by main scanning in the X direction, and a sub-scanning driving device for moving the carriage by sub-scanning in the Y direction. The carriage supports the plurality of heads each of which is inclined at an in-plane inclination angle θ.

16 Claims, 23 Drawing Sheets

FOREIGN PATENT DOCUMENTS

| | | |
|---|---|---|
| JP | 07-081049 | 3/1995 |
| JP | 09-039220 | 2/1997 |
| JP | 09-300664 | 11/1997 |
| JP | A-10-151755 | 6/1998 |
| JP | 10-272776 | 10/1998 |
| JP | A 11-20176 | 1/1999 |
| JP | 11-078013 | 3/1999 |
| JP | 11-248927 | 9/1999 |
| JP | 11-279752 | 10/1999 |
| JP | 11-334049 | 12/1999 |
| JP | 2000-89017 | 3/2000 |
| JP | 2000-123975 | 4/2000 |
| JP | A-2000-147241 | 5/2000 |
| JP | 2000-323276 | 11/2000 |
| JP | 2000-334951 | 12/2000 |
| JP | A-2001-066408 | 3/2001 |
| JP | 2001-096734 | 4/2001 |
| WO | WO 95-07185 | 3/1995 |

* cited by examiner

APPARATUS AND METHOD FOR PRODUCING COLOR FILTERS BY DISCHARGING MATERIAL

BACKGROUND OF THE INVENTION

1. Field of Invention

The present invention relates to an apparatus and method for discharging a material onto an object. Particularly, the present invention relates to an apparatus and method for producing a color filter used for optical devices such as a liquid crystal device, and the like. The present invention also relates to an apparatus and method for manufacturing a liquid crystal device having a color filter. The present invention further relates to an apparatus and method for manufacturing an electroluminescence (EL) device for displaying by using an EL luminescent layer. The present invention further relates to an electronic apparatus manufactured by any one of the above-described methods.

2. Description of Related Art

Recently, display devices, such as a liquid crystal device, an electroluminescence device (EL device), and the like have been widely used as display sections of electronic apparatuses, such as a cell phone, a portable computer, etc. Additionally, in recent years, a full-color display made by display devices has been increasingly used. A full-color display of a liquid crystal device can be made by, for example, transmitting light, which is modulated by a liquid crystal layer, through a color filter. The color filter can include dot-shaped color filter elements of R (red), G (green) and B (blue) which are formed in a predetermined arrangement such as a stripe, delta, or mosaic arrangement on the surface of a substrate of glass, plastic, or the like.

In a full-color display of an EL device, dot-shaped EL luminescent layers of R (red), G (green) and B (blue) colors are provided in a predetermined arrangement on electrodes, which are formed in any desired arrangement, on the surface of a substrate made of, for example, glass, plastic, or the like. The voltage applied to these electrodes is controlled for each pixel to emit light of a desired color from each pixel, thereby performing a full-color display.

It is conventionally known that a photolithography process can be used for patterning the filter elements of each of the R, G, and B colors of the color filter, or patterning the pixels of each of the R, G, and B colors of the EL device. However, the use of the photolithography process has the problem of complicating the process, and increasing the cost due to the high consumption of each color material and photoresist, etc.

In order to solve the problem, a method has been proposed, in which a filter material, an EL luminescent material, or the like is discharged in a dot shape to form a dot-arrangement filament or EL luminescent layer, or the like.

Consideration will now be given to a case in which as shown in FIG. 22(b), a plurality of dot-shaped filter elements 303 are formed by an ink jet method in each of a plurality of panel areas 302, which are set on the surface of a large-area substrate of glass, plastic, or the like, i.e., a so-called mother board 301 shown in FIG. 22(a). In this case, during several times (twice in the case shown in FIG. 22(b)) of main scanning with an ink jet head 306 having a nozzle row 305 including a plurality of nozzles 304 arranged in a row as shown in FIG. 22(c) for each panel area 302, as shown by arrows A1 and A2 in FIG. 22(b), an ink, i.e., a filter material, is discharged from the plurality of nozzles to form the filter elements 303 at desired positions.

The filter elements 303 of each of the R, G, and B colors are formed in an appropriate arrangement, such as a stripe, delta or mosaic arrangement. Therefore, for ink discharge from the ink jet head 306, the ink jet head 306 for discharging each of the R, G, and B colors is previously provided for each of the three colors R, G and B so that the ink jet heads 306 are successively used to form an arrangement of the three colors of R, G and B on the mother board 301, as shown in FIG. 22(b).

The number of the nozzles provided on the ink jet head 306 is generally about 160 to 180. The mother board 301 generally has a larger area than the ink jet head 306. Therefore, in forming the filter elements 303 on the surface of the mother board 301 by using the ink jet head 306, the ink jet head 306 must be moved several times on the mother board 301 by main scanning while being moved relative to the mother board 301 by sub-scanning to discharge ink during each time of main scanning, drawing a pattern.

However, this method has the problem of requiring a long drawing time, i.e., a long time for producing a color filter, because of the large number of times of scanning of the mother board 301 with the ink jet head. In order to solve this problem, the applicant proposed a method in Japanese Application No. 11-279752 in which a plurality of heads are linearly arranged and supported by a supporting member to increase the substantial nozzle number.

By using this method, for example, as shown in FIG. 23(a), a plurality of heads 306, e.g., six heads 306, are linearly supported by a supporting member 307, and a main scanning can be performed numerous times, as shown by arrows A1, A2, . . . with movement of the supporting member 307 by sub-scanning in the sub-scanning direction Y, to selectively discharge ink from each of nozzles 304 during each time of main scanning. This method can supply the ink to a wide area by one time of main scanning, thereby certainly shortening the time required for producing a color filter.

SUMMARY OF THE INVENTION

In the conventional method shown in FIG. 23(a), each of the heads 306 is arranged in parallel with the sub-scanning direction Y to form a linear nozzle row, and thus the distance between the plurality of the nozzles, i.e., the nozzle pitch, must be the same as the distance between the filter elements 303 on the mother board 301, i.e., the element pitch. However, it is very difficult to form an ink jet head so that the nozzle pitch is the same as the element pitch.

A possible method for solving the problem is to incline the supporting member 307 at an angle θ with the sub-scanning direction Y, coinciding the nozzle pitch of the heads 306 with the element pitch on the mother board 301, as shown in FIG. 23(b). However, in this case, a deviation with a dimension Z in the main scanning direction X occurs in the nozzle row formed by the heads 306 arranged in a row, thereby causing the problem of increasing the main scanning time for ink discharge by a time corresponding to the deviation. Particularly, in the use of such a six-linked structure head unit as shown in FIG. 23(b), the deviation has a long dimension because of the long nozzle row, thereby causing the problem of the need to further increase the main scanning time.

The present invention has been made in consideration of the above problem, and an object of the present invention is to shorten the scanning time of an in ink jet head for forming a pattern of filter elements of a color filter, picture element pixels of an EL device, or the like.

In order to achieve the object, an apparatus for discharging a material to an object according to the present invention can include a plurality of heads each having a nozzle row including an arrangement of a plurality of nozzles, a supporting mechanism for supporting the plurality of the heads and a mechanism for scanning one of the object and the supporting mechanism relative to the other, wherein the nozzle row is inclined relative to the scanning direction. More specifically, the plurality of the heads can be supported obliquely relative to the longitudinal direction of the supporting mechanism. The term "scanning" can mean one or both of main scanning in a main scanning direction and sub-scanning in a sub-scanning direction crossing the main scanning direction.

In the apparatus for discharging a material of the present invention, a substrate is scanned with the supporting mechanism for supporting the plurality of the heads so that the material can be discharged from the plurality of the heads. Therefore, the scanning time can be shortened, as compared with scanning of an object with a single head.

In the present invention, preferably, the plurality of the heads have substantially the same nozzle pitch of the nozzle rows, and substantially the same inclination angles of the nozzle rows. The reason for this is that the material to be discharged can be regularly discharged to the object to facilitate control for drawing a regular pattern.

Since scanning is performed with each of the heads in an inclined state, the nozzle pitch of the nozzles belonging to each of the heads can be coincided with the element pitch of the filter elements formed on the object. Furthermore, since each of the heads is inclined, and not the entire supporting mechanism, the distance between the nozzle closest to the substrate and the nozzle far from the substrate is shorter than the case in which the entire supporting mechanism is inclined, thereby shortening the scanning time of the substrate with the supporting mechanism.

In another aspect of the present invention, an apparatus for discharging a material to an object can include a plurality of heads each having a nozzle row including an arrangement of a plurality of nozzles, a supporting mechanism for supporting the plurality of the heads, a mechanism for scanning one of the object and the supporting mechanism relative to the other, and a mechanism for controlling the angle formed by at least one of the nozzle rows and the scanning direction. The apparatus for discharging a material preferably further includes a mechanism for controlling the spacing between the plurality of the nozzle rows.

In the apparatus for discharging a material having the above construction, the nozzle rows are set in an inclined state by the nozzle row angle control mechanism, thereby obtaining the same effect as the above-described apparatus for discharging a material.

In the apparatus for discharging a material, the heads supported by the supporting mechanism can be coincided with different element pitches by the function of the nozzle row angle control mechanism. In this case, the distance between the adjacent nozzle rows can be precisely controlled by the function of the nozzle row spacing control mechanism so that the nozzle rows continue with a constant nozzle pitch.

It is to be understood that the nozzle row angle control mechanism and the nozzle row spacing control mechanism are not limited to special structures, and the above-described functions can be achieved by any achievable structure. For example, the nozzle row angle control mechanism can be achieved by the following: each of the heads is mounted on the supporting mechanism to be rotatable in a plane, and connected to a power source such as a pulse motor, a servo motor, or the like, which can control a rotational angle, directly or indirectly through a power transmission mechanism. In this construction, the inclination angle of each nozzle row can be controlled to a desired value by controlling the output angle value of the power source, and the inclination angle of each nozzle row can also be fixed to the desired value by maintaining the output shaft of the power source in a lock state after control of the angle.

The nozzle spacing control mechanism is also not limited to a special structure, and the function can be achieved by any achievable structure. For example, the function can be achieved by a structure in which the planar rotation center of each of the heads is slidably mounted on the supporting member, and the heads are connected to reciprocating slide movement driving means. The reciprocating slide movement driving means can be formed by, for example, a slide driving device comprising as a power source a rotating device such as a pulse motor, a servo motor, or the like, which can control the rotational angle, and a slide driving device comprising a linear movement driving source such as a linear motor, or the like.

The mechanism for controlling the angle formed by the nozzle row and the scanning direction can preferably control the angle so that the plurality of heads substantially the same nozzle pitch and substantially the same inclination angle of the nozzle rows.

A method of discharging a material to an object according to the present invention can include scanning either a plurality of heads or a supporting mechanism for supporting the plurality of the heads relative to the other, the heads each having a nozzle row comprising an arrangement of a plurality of nozzles and discharging the material to the object, wherein at least one of the nozzle rows is inclined relative to the scanning direction. In this case, one of the object and the supporting member is scanned relative to the other in a main scanning direction or a sub-scanning direction crossing the main scanning direction, or in both directions.

Preferably, the plurality of the heads have substantially the same nozzle pitch and substantially the same inclination angle of the nozzle rows.

The method for discharging a material preferably further comprises the step of controlling the angle formed by at least one of the nozzle rows and the scanning direction, or the step of controlling the spacing between the plurality of nozzle rows.

The apparatus and method for discharging a material can be used for, for example, an apparatus for producing a color filter by discharging a filter material to a substrate, a method of producing a color filter, an apparatus and method for manufacturing an EL device by discharging an EL luminescent material to a substrate, etc. Of course, applications are not limited to these apparatuses and methods, and there are applications to various technical fields.

Particularly, a component produced by a production method including the method of discharging a material can be used for electronic apparatuses such as a cell phone, a portable computer, and the like.

An apparatus for producing a color filter of the present invention can include a plurality of heads each having a nozzle row comprising an arrangement of a plurality of nozzles, and a supporting mechanism for supporting the plurality of the heads, wherein the supporting mechanism supports the plurality of heads in an inclined state.

In this construction, a filter possibly comprises colorants of the three primary colors including R (red), G (green), and B (bleu), or C (cyan), Y (yellow) and M (magenta), for example.

The apparatus for producing a color filter can discharge a filter material from the plurality of heads during main scanning of a substrate with supporting mechanism for supporting the plurality of heads, shortening the scanning time, as compared with scanning of an object surface with a single head.

Since scanning is performed with each of the heads in an inclined state, the nozzle pitch of the nozzles belonging to each of the heads can be coincided with the element pitch of the filter elements formed on the substrate. Furthermore, since each of the heads is inclined, and not the entire supporting mechanism, the distance between the nozzle closest to the substrate and the nozzle far from the substrate is shorter than the case in which the entire supporting mechanism is inclined, thereby shortening the scanning time of the substrate with the supporting mechanism. Therefore, the time required for producing a color filter can be shortened.

In the apparatus for producing a color filter having the above construction, the supporting mechanism can support the heads in a fixed state, or in a state wherein the inclination angle and/or the head-to-head distance can be changed.

In the apparatus for producing a color filter having the above construction, preferably, the plurality of the heads have substantially the same nozzle pitch of the nozzle rows, and substantially the same inclination angle of the nozzle rows. This can facilitate control for feeding the filter material to desired positions.

The inclination angles of the nozzle rows are preferably the same in magnitude, but the inclination angles may change in direction between the plus and minus directions. Hereinafter, "substantially the same" can mean cases including a case in which no great difference occurs in functions even when a small difference occurs due to error in production.

In a further aspect of the present invention, an apparatus for producing a color filter can include a plurality of heads each having a nozzle row including an arrangement of a plurality of nozzles; a mechanism for supplying a filter material to the heads, a supporting mechanism for supporting the plurality of the heads, a main scanning mechanism for performing main scanning with the supporting mechanism, a sub-scanning mechanism for performing sub-scanning with the supporting mechanism, and a nozzle row angle control mechanism for controlling the inclination angles of the plurality of nozzle rows, and a nozzle row spacing control mechanism for controlling the spacing between the plurality of nozzle rows.

In the apparatus for producing a color filter having the above construction, each of the nozzle rows is set in an inclined state by the nozzle row angle control mechanism, thereby obtaining the same effect as the above-described apparatus for producing a color filter.

In the apparatus for producing a second color filter, the heads supported by the supporting mechanism can easily be coincided with different element pitches by the function of the nozzle row angle control mechanism. In this case, the distance between the adjacent nozzle rows can be precisely controlled by the function of the nozzle row spacing control mechanism so that the nozzle rows continue with a constant nozzle pitch.

It should be understood that the nozzle row angle control mechanism and the nozzle row spacing control mechanism are not limited to special structures, and the above-described functions can be achieved by any achievable structure. For example, the same structures as described above for the apparatus for discharging a material can be used.

In the apparatus for producing a color filter, preferably, the plurality of heads have substantially the same nozzle pitch and substantially the same inclination angles of the nozzle rows.

A method of producing a color filter according to the present invention can include scanning a plurality of heads each having a nozzle row having an arrangement of a plurality of nozzles in a main scanning direction while discharging a filter material from the plurality of nozzles to form filter elements on a substrate, wherein a plurality of heads are provided and arranged in an inclined state.

In the above method of producing a color filter, the plurality of the heads are moved simultaneously in a main scanning direction so that the material can be discharged from each of the heads. Therefore, the scanning time can be shortened, as compared with scanning of the substrate surface with a single head.

Since scanning is performed with each of the heads in an inclined state, the nozzle pitch of the nozzles belonging to each of the heads can be coincided with the element pitch of the filter elements formed on the substrate. Furthermore, since each of the heads is inclined, not a row of the plurality of heads, the distance between the nozzle closest to the substrate and the nozzle far from the substrate is shorter than the case in which the head row is inclined, thereby shortening the scanning time of the substrate with the plurality of nozzle rows. Therefore, the time required for producing a color filter can be shortened.

In the method of producing a color filter having the above construction, preferably, the plurality of the heads have substantially the same nozzle pitch and substantially the same inclination angle of the nozzle rows.

An apparatus for manufacturing a liquid crystal device of the present invention can include a plurality of heads each having a nozzle row having an arrangement of a plurality of nozzles, a mechanism that supplies a filter material to the heads, a supporting mechanism that supports the plurality of the heads, a main scanning mechanism that moves the supporting mechanism by main scanning, and a sub-scanning mechanism that moves the supporting mechanism by sub-scanning, wherein the supporting mechanism supports the plurality of heads in an inclined state.

The apparatus for manufacturing a liquid crystal device can discharge ink, i.e., a filter material, from the plurality of heads during main scanning of a substrate with supporting mechanism that supports the plurality of heads, shortening the scanning time, as compared with scanning of a substrate surface with a single head.

Since scanning is performed with the each of the heads in an inclined state, the nozzle pitch of the nozzles belonging to each of the heads can be coincided with the element pitch of the filter elements formed on the substrate. Furthermore, since each of the heads is inclined, and not the entire supporting mechanism, the distance between the nozzle closest to the substrate and the nozzle far from the substrate is shorter than the case in which the entire supporting means is inclined, thereby shortening the scanning time of the substrate with the supporting means. Therefore, the time required for producing a color filter can be shortened.

A method of manufacturing a liquid crystal device of the present invention can include moving, in a main scanning direction, a head having a nozzle row having an arrangement of a plurality of nozzles while discharging a filter material from the plurality of nozzles to form a filter element on a substrate, wherein a plurality of the heads are provided to be arranged in an inclined state.

The manufacturing method can discharge ink from the plurality of heads while simultaneously moving the plurality of heads by main scanning, shortening the scanning time, as compared with scanning of a substrate surface with a single head.

Since scanning is performed with the each of the heads in an inclined state, the nozzle pitch of the nozzles belonging to each of the heads can be coincided with the element pitch of the filter elements formed on the substrate. Furthermore, since each of the heads is inclined, and not a row of the plurality of heads, the distance between the nozzle closest to the substrate and the nozzle far from the substrate is shorter than the case in which the head row is inclined, thereby shortening the scanning time of the substrate with the plurality of nozzle rows. Therefore, the time required for producing a color filter, i.e., the time required for manufacturing a liquid crystal device, can be shortened.

An apparatus for manufacturing an EL device of the present invention can include a plurality of heads each having a nozzle row including an arrangement of a plurality of nozzles, a mechanism that supplies an EL luminescent material to the heads, a supporting mechanism that supports the plurality of the heads, a main scanning mechanism that moves the supporting mechanism by main scanning, a sub-scanning mechanism that moves the supporting mechanism by sub-scanning, a nozzle row angle control mechanism for controlling the inclination angles of the plurality of the nozzle rows, and a nozzle row spacing control mechanism for controlling the distance between the plurality of the nozzle rows.

The apparatus for manufacturing an EL device can discharge ink, i.e., an EL luminescent material, from the plurality of heads during main scanning of a substrate with the supporting mechanism that supports the plurality of heads, shortening the scanning time, as compared with scanning of a substrate surface with a single head.

Since scanning is performed with the each of the heads in an inclined state, the nozzle pitch of the nozzles belonging to each of the heads can be coincided with the pixel pitch of the picture element pixels formed on the substrate. Furthermore, since each of the heads is inclined, and not the entire supporting mechanism, the distance between the nozzle closest to the substrate and the nozzle far from the substrate is shorter than the case in which the entire supporting mechanism is inclined, thereby shortening the scanning time of the substrate with the supporting mechanism. Therefore, the time required for manufacturing an EL device can be shortened.

A method of manufacturing an EL device of the present invention can include moving, in a main scanning direction, a head having a nozzle row having an arrangement of a plurality of nozzles while discharging an EL luminescent material from the plurality of nozzles to form an EL luminescent layer on a substrate, wherein a plurality of the heads are provided to be arranged in an inclined state.

The apparatus for manufacturing an EL device can discharge ink, i.e., an EL luminescent material, from the plurality of heads while simultaneously moving the plurality of heads by main scanning, shortening the scanning time, as compared with scanning of a subject surface with a single head.

Since scanning is performed with the each of the heads in an inclined state, the nozzle pitch of the nozzles belonging to each of the heads can be coincided with the pixel pitch of the picture element pixels formed on the substrate. Furthermore, since each of the heads is inclined, and not a row of the plurality of heads, the distance between the nozzle closest to the substrate and the nozzle far from the substrate is shorter than the case in which the head row is inclined, thereby shortening the scanning time of the substrate with the plurality of nozzle rows. Therefore, the time required for producing an EL device can be shortened.

BRIEF DESCRIPTION OF THE DRAWINGS

The invention will be described with reference to the accompanying drawings, in which like elements are referred to with like numbers, and in which:

FIG. 13 is a drawing showing the internal structure of a head, in which FIG. 13(a) is a partially cut-away perspective view, and FIG. 13(b) is a sectional view taken along line J—J in FIG. 13(a);

DETAILED DESCRIPTION OF PREFERRED EMBODIMENTS

A method and apparatus for producing a color filter according to an embodiment of the present invention will be described below. Before the production method and apparatus are described, a color filter produced by the production method is described. FIG. 6(a) schematically shows the planar structure of a color filter according to an embodiment. FIG. 7(d) shows a sectional structure taken along line VII—VII in FIG. 6(a).

The color filter 1 of this embodiment includes a plurality of filter elements 3 which are formed in a dot pattern, which is in this embodiment a dot matrix, on a surface of a rectangular substrate 2 made of glass, plastic, or the like, and a protecting film 4 laminated on the filter elements 3 as shown in FIG. 7(d). FIG. 6(a) is a plan view of the color filter 1 with the protecting film 4 being removed. Namely, in this embodiment, a color pattern formed by ink jet is illustrated by the filter elements 3.

Figure 8:
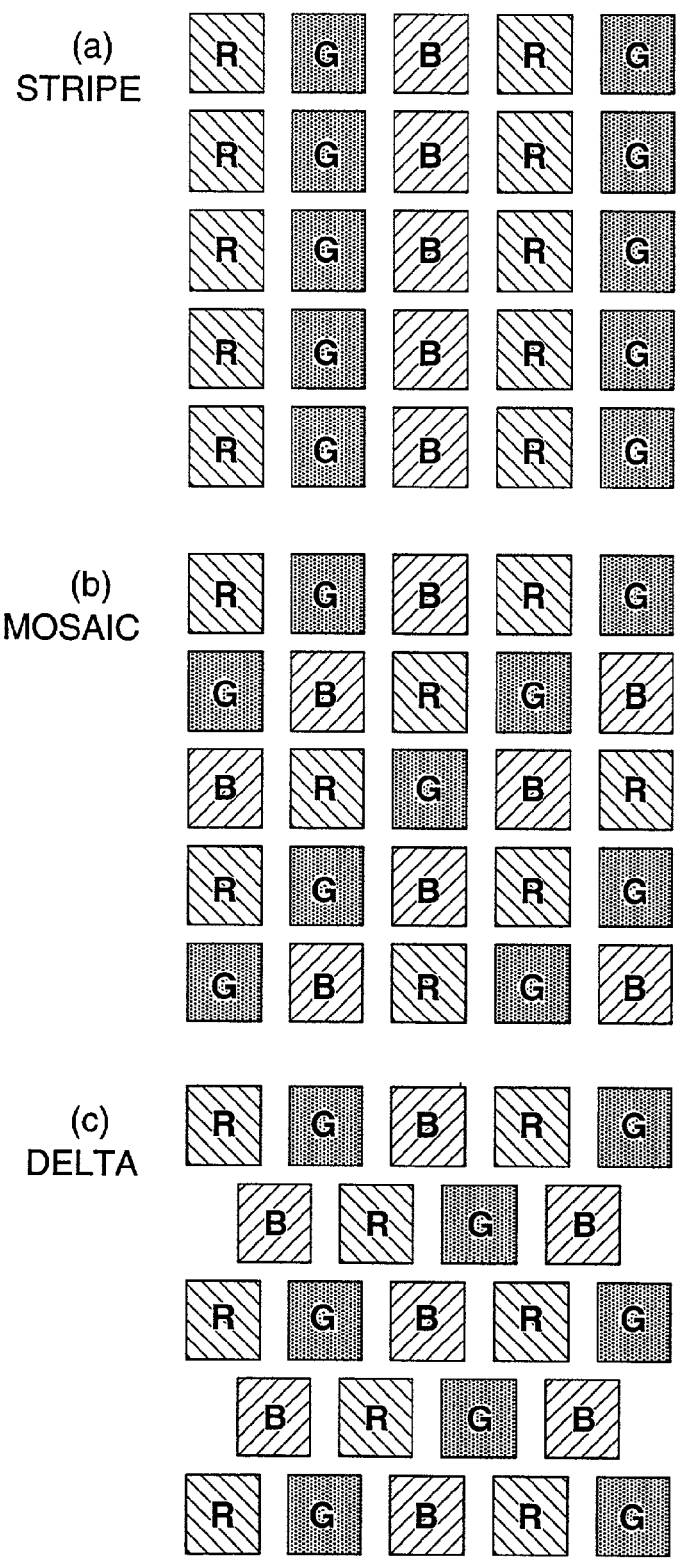
FIG. 8 is a drawing showing examples of arrangement of picture element pixels of the three colors R, G and B in a color filter.

The filter elements 3 can be formed by filling colorants in a plurality of rectangular regions, which are arranged in a dot matrix and are divided by a partition 6 made of a non-transmissive resin material and formed in a lattice pattern. Each of the filter elements 3 is made of any one of colorants of R (red), G (green) and B (blue), and the filter elements 3 of each color are arranged in a predetermined pattern. As the arrangement, for example, the stripe arrangement shown in FIG. 8(a), the mosaic arrangement shown in FIG. 8(b), and the delta arrangement shown in FIG. 8(c) are known.

In the stripe arrangement, all filter elements in each column of a matrix are the same color. In the mosaic arrangement, any three filter elements arranged in a vertical and horizontal lines are respectively R (red), G (green) and B (blue). In the delta arrangement, the filter elements are arranged to be staggered so that any three adjacent filter elements are respectively the three colors of R, G and B.

The size of the color filter 1 is, for example, 1.8 inches. The size of each of the filter elements 3 is, for example, 30 µm×100 µm. The distance between the respective filter elements 3, i.e., the element pitch, is 75 µm, for example.

When the color filter 1 of this embodiment is used as an optical element for a full-color display, the three filter elements 3 of the R, G, and B colors are combined as a unit to form a pixel, and light is selectively transmitted through any one of R, G and B or a combination thereof in each pixel to perform a full-color display. In this case, the partition 6 made of a non-transmissive resin material functions as a black matrix.

The color filter 1 is cut out of a large-area mother board 12, for example, as shown in FIG. 6(b). Specifically, a pattern for one color filter is formed on the surface of each of a plurality of color filter formation areas 11 set in the mother board 12, cutting grooves are formed around the color filter formation areas 11, and then the mother board 12 is cut along the grooves to form the respective color filters 1.

The method and apparatus for producing the color filter 1 shown in FIG. 6(a) will be described below.

Figure 7:
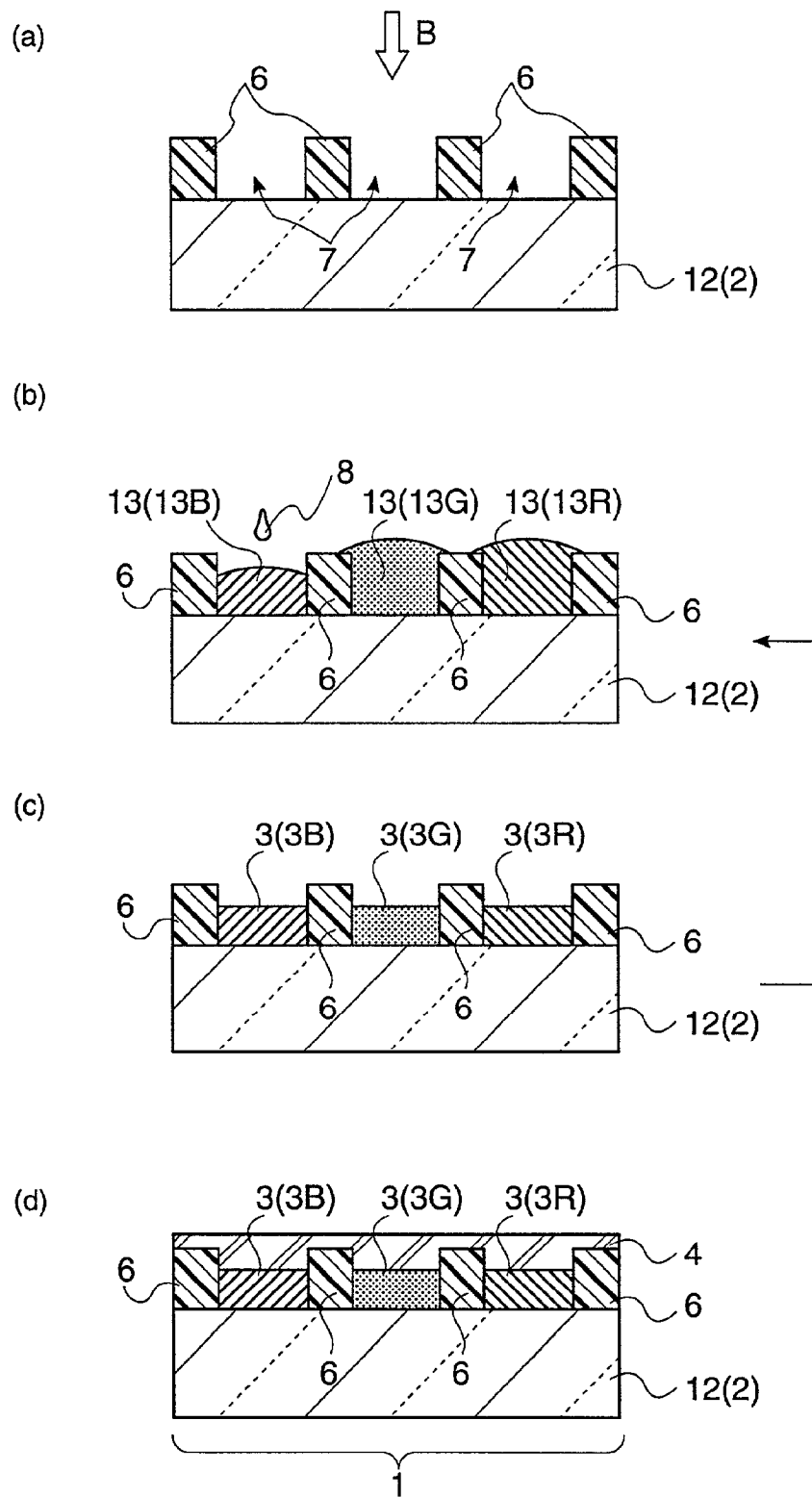
FIG. 7 is a sectional view schematically showing the steps for producing a color filter, taken along line VII—VII in FIG. 6(a)

FIG. 7 schematically shows the steps of the method of producing the color filter 1. First, the partition 6 made of a non-transmissive resin material can be formed in a lattice pattern on the surface of the mother board 12, as viewed from the direction of arrow B. The lattice holes 7 of the lattice pattern are areas in which the filter elements 3 are formed, i.e., the filter element areas. Each of the filter element formation areas 7 formed by the partition 6 has planar dimensions of, for example, about 30 µm×100 µm, as viewed from the direction of arrow B.

The partition 6 can function to prohibit a flow of ink, i.e., a filter element material, supplied to the filter element formation areas 7, and function as the black matrix. The partition 6 is formed by any desired patterning method, for example, a photolithography method, and is further heated by a heater according to demand.

After the partition 6 is formed, droplets 8 of a filter element material are supplied to each of the filter element formation areas 7 to fill each of the filter element areas 7 with a filter element material 13, as shown in FIG. 7(b). In FIG. 7(b), reference numeral 13R denotes the filter element material having R (red) color, reference numeral 13G denotes the filter element material having G (green) color, and reference numeral 13B denotes the filter element material having B (blue) color.

After a predetermined amount of the filter element material is supplied to each of the filter element formation areas 7, the mother board 12 is heated to about 70° C. by the heater to evaporate the solvent of the filter element materials. The evaporation decreases the volume of the filter element materials 13 to planarize the surface, as shown in FIG. 7(c). When the volume is extremely decreased, droplets of the filter element materials are supplied and heated repeatedly until the color filter has a sufficient thickness. By the above-described process, only the solid contents of the filter element materials finally remains to form films, thereby forming the filter elements 3 of each of the desired colors.

After the filter elements 3 are formed as described above, heating is carried out at a predetermined temperature for a predetermined time in order to completely dry the filter elements 3. Then, the protecting film 4 is formed by using an appropriate method, for example, a spin coating method, a roll coating method, a dipping method, or the like. The protecting film 4 is formed for protecting the filter elements 3 and for planarizing the surface of the color filter 1.

Figure 9:
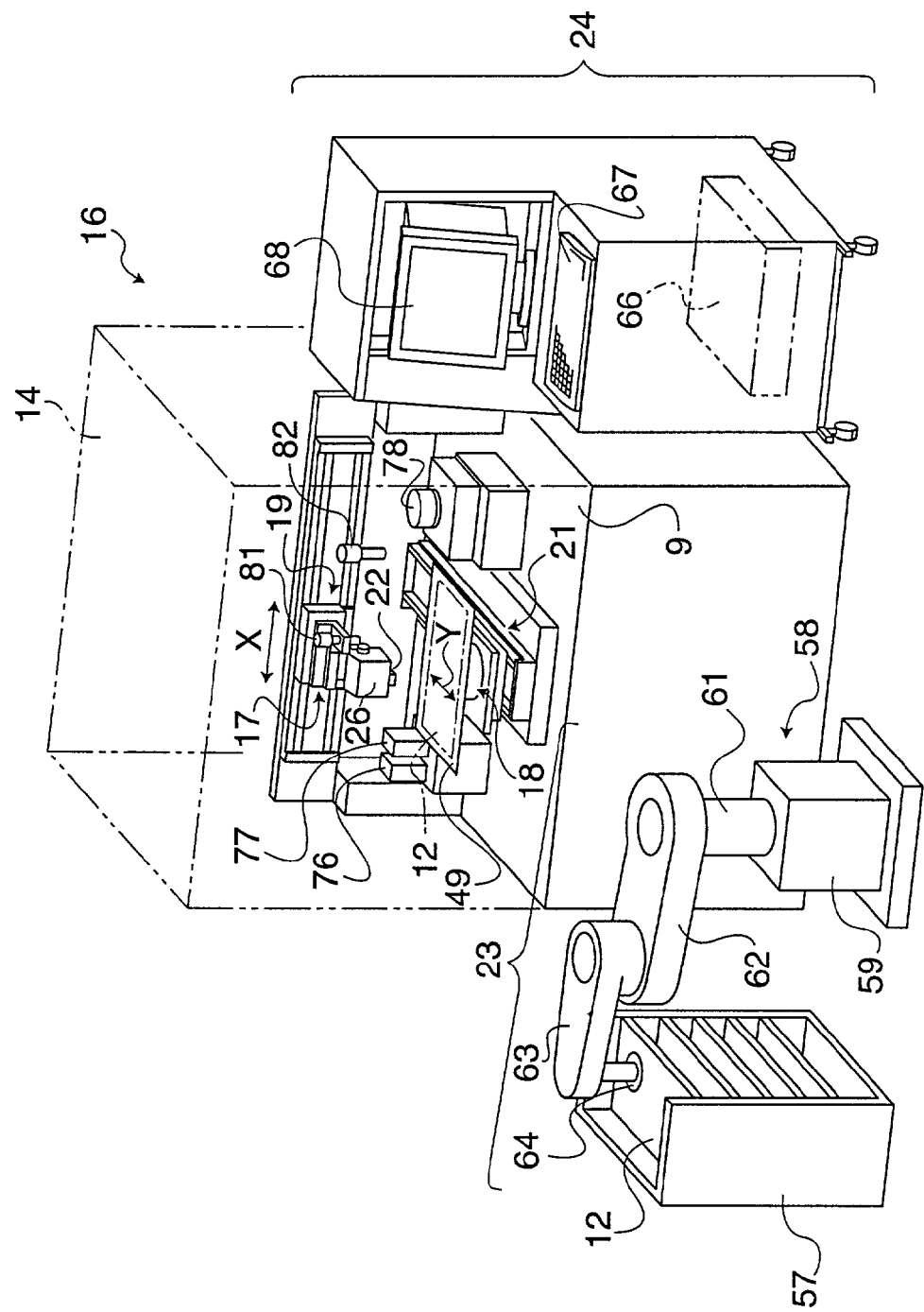
FIG. 9 is a perspective view showing an ink jet apparatus according to an embodiment of the present invention.

FIG. 9 shows a component device of an apparatus for producing a color filter, i.e., an ink jet apparatus for supplying the filter element materials shown in FIG. 7(b) in accordance with an embodiment. The ink jet apparatus 16 is an apparatus for discharging and adhering the filter element material of one of the colors R, G and B, for example, R color, as ink droplets to a predetermined position in each of the color filter formation areas 11 of the mother board 12 (refer to FIG. 6(b)). Although an ink jet apparatus is prepared for the filter element materials of each of the G and B colors, these ink jet apparatuses for the G and B colors are not described below because the structures thereof are the same as FIG. 9.

In FIG. 9, the ink jet apparatus 16 can include a head unit 26 having an ink jet head 22, a head position control device 17 for controlling the position of the ink jet head 22, a board position control device 18 for controlling the position of the mother board 12, a main scanning driving device 19 for moving the ink jet head 22 relative to the mother board 12 by main scanning, a sub-scanning driving device 21 for moving the ink jet head 22 relative to the mother board 12 by sub-scanning, a board feeder 23 for feeding the mother board 12 to a predetermined working position in the ink jet apparatus 16, and a control device 24 for controlling the entirety of the ink jet apparatus 16.

The head position control device 17, the board position control device 18, the main scanning driving device 19 and the sub-scanning driving device 21 are provided on a base 9. These devices are covered with a cover 14 according to demand.

Figure 2:
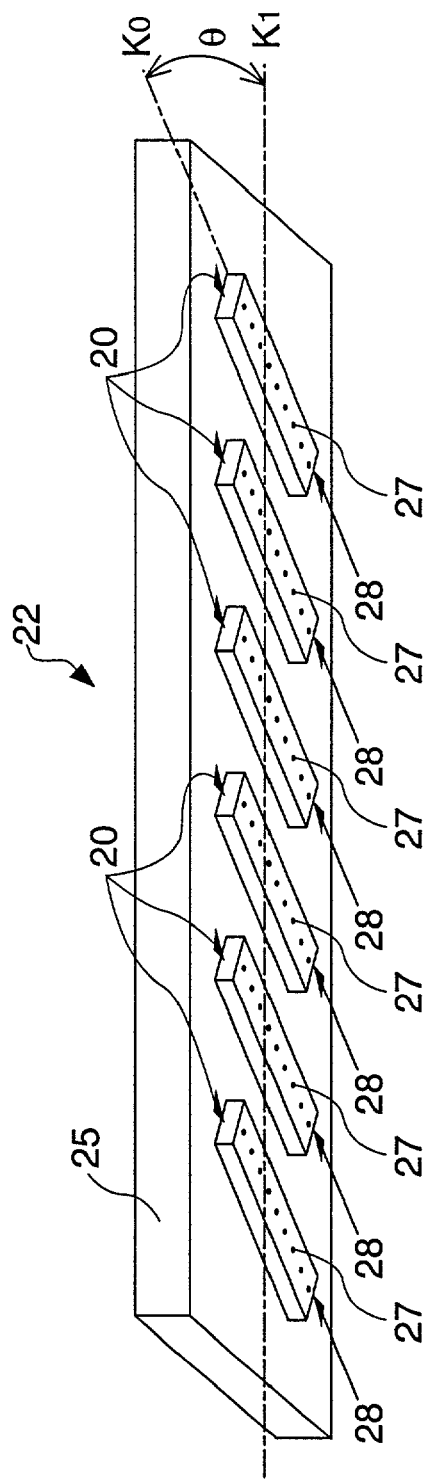
FIG. 2 is a perspective view of the ink jet head shown in FIG. 1.

The ink jet head 22 has a plurality of heads 20, in this embodiment, six heads 20, and a carriage 25 serving as a supporting mechanism that supports the heads 20 arranged, as shown in FIG. 2. The carriage 25 has holes, i.e., recesses, which are slightly larger than the heads 20 and which are formed at supporting positions of the heads 20, so that the heads 20 are respectively placed in the holes, and fixed by screws, an adhesive, or another tightening technique. When the positions of the heads 20 relative to the carriage 25 are precisely determined, the heads 20 may be fixed by simply pressing them into the holes, without using special tightening techniques.

Figure 6:
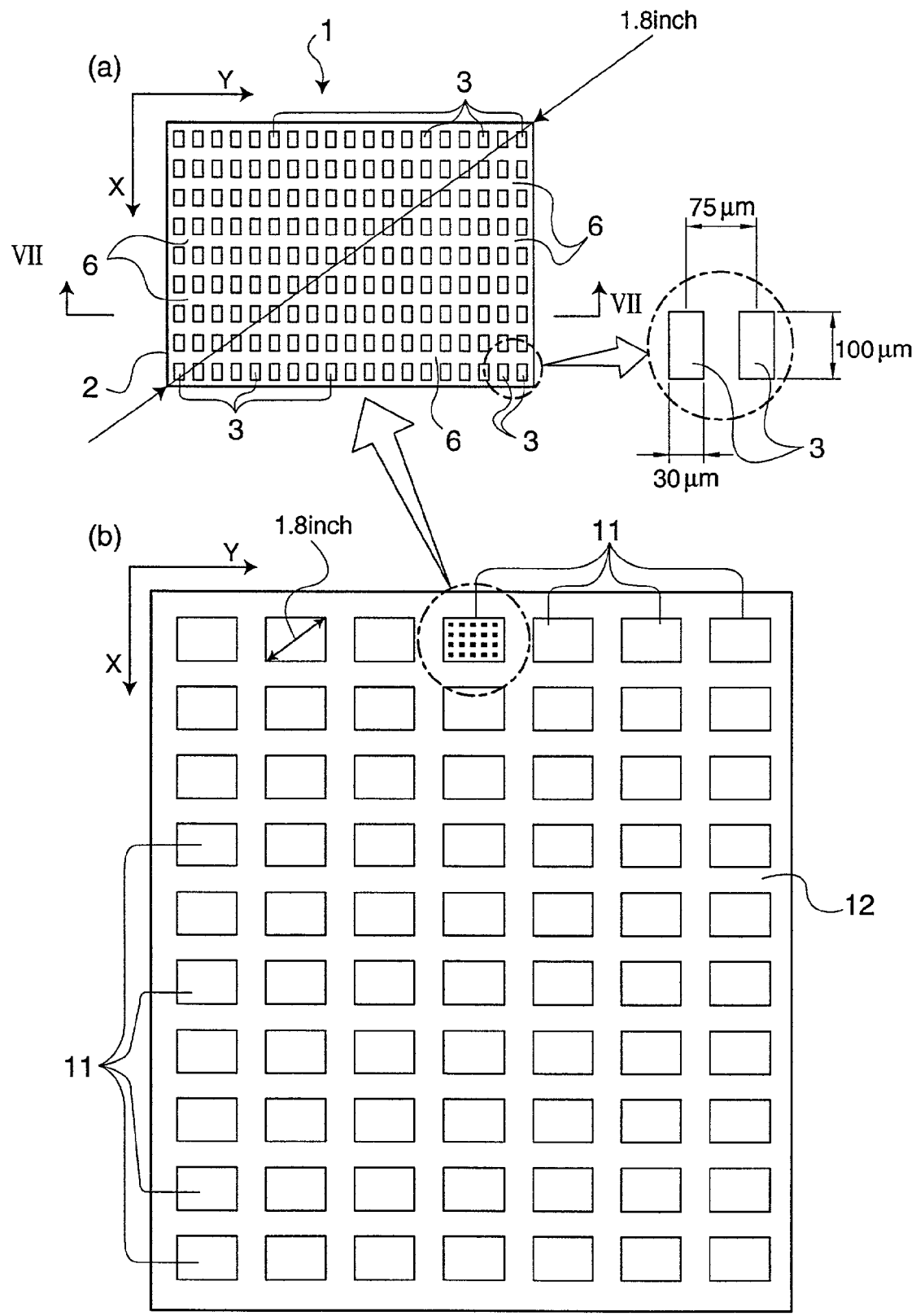
FIG. 6(a) is a plan view showing a color filter according to an embodiment of the present invention.
FIG. 6(b) is a plan view showing a mother board serving as a base of the color filter according to an embodiment of the present invention.
Figure 11:
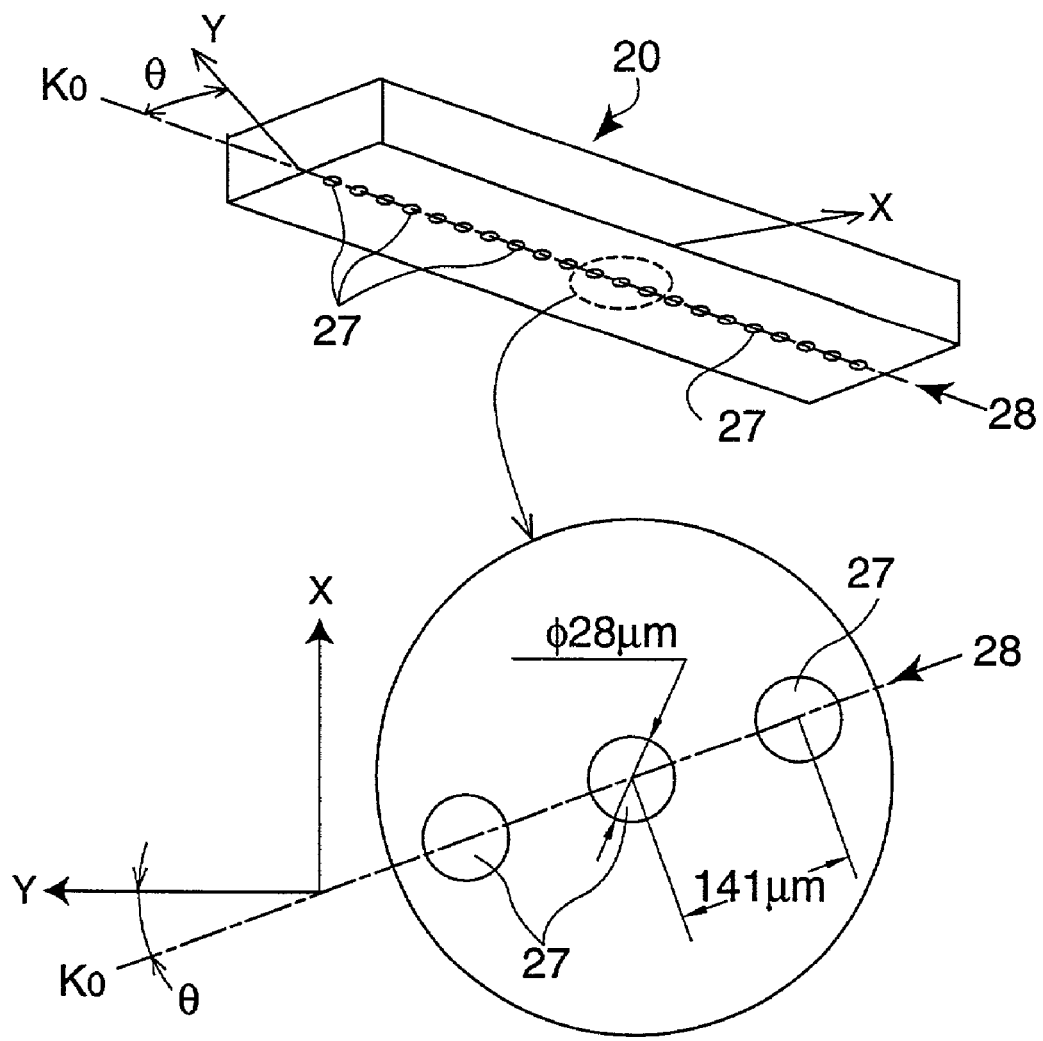
FIG. 11 is a perspective view showing a head provided in the ink jet head shown in FIG. 1.

Each of the heads 20 has a nozzle row 28 including a plurality of nozzles 27 arranged in a row, for example, as shown in FIG. 11. The number of the nozzles 27 is, for example, 180, and the hole diameter of the nozzles 27 is, for example, 28 µm. The nozzle pitch of the nozzles 27 is, for example, 141 µm. In FIGS. 6(*a*) and 6(*b*), the main scanning direction X of the mother board 12, and the sub-scanning direction Y perpendicular to the main scanning direction X are set as shown in FIG. 11.

Figure 1:
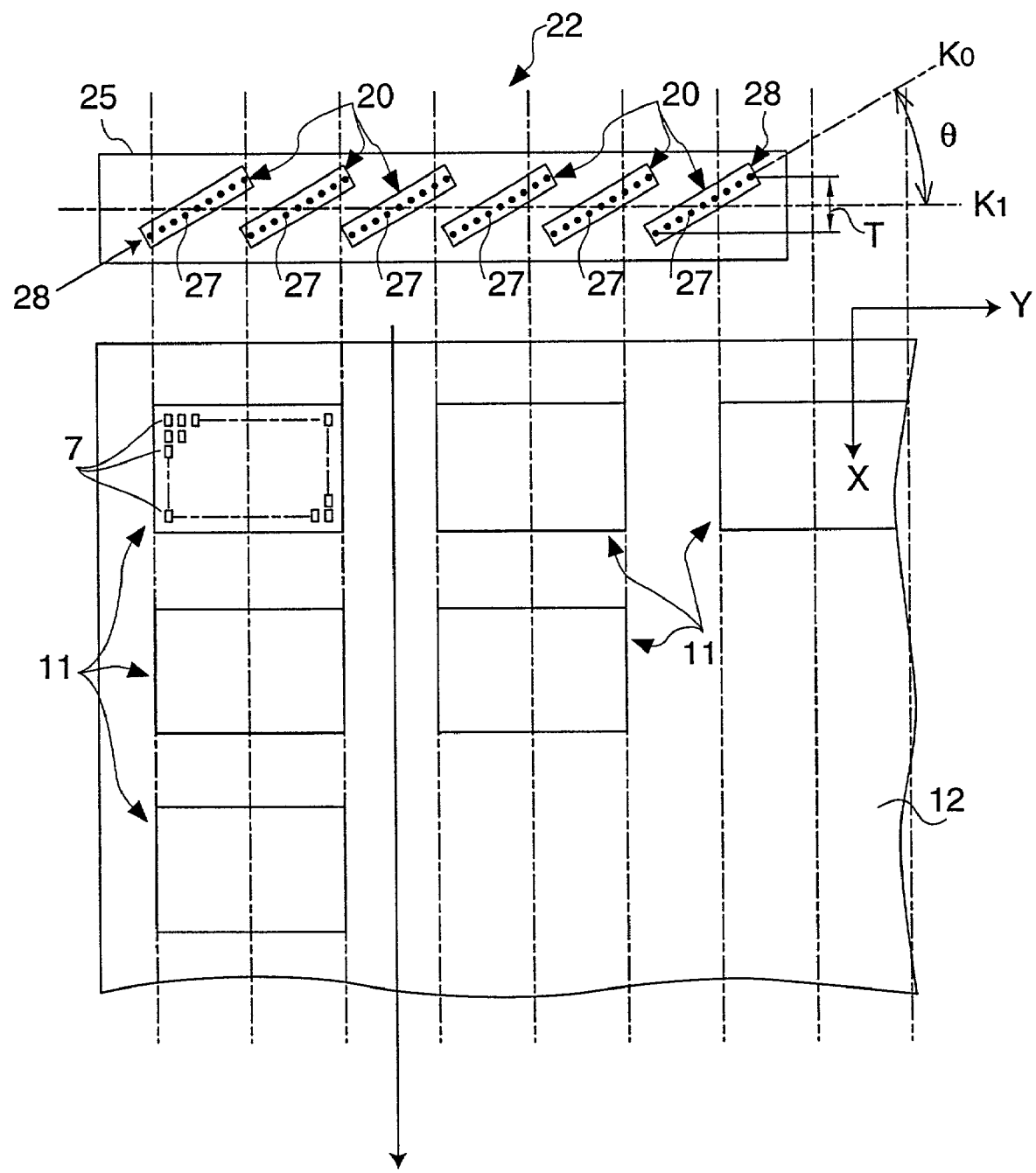
FIG. 1 is a plan view schematically showing a main step of a production method using an apparatus for producing a color filter according to an embodiment of the present invention.

In FIG. 2, each of the heads 20 is mounted on the carriage 25 so that the nozzle row 28 of each head extends in a direction K0 at an angle θ with the axis line K1 of the carriage 25 in the longitudinal direction. In this embodiment, the ink jet head 22 is positioned so that the axis line K1 of the carriage 25 extends in a direction crossing the main scanning direction X, e.g., in this embodiment, the perpendicular direction, as shown in FIG. 1. Namely, each of the nozzle rows 28 is positioned obliquely at an angle θ with the sub-scanning direction Y perpendicular to the main scanning direction.

The ink jet head 22 is moved in parallel to the X direction to perform main scanning of the mother board 12. During this main scanning, the filter element material as an ink is selectively discharged from the plurality of nozzles 27 of each of the heads 20 to adhere the filter element material at predetermined positions in the mother board 12. The ink jet head 22 can be moved by a predetermined distance in the sub-scanning direction, for example, moved by a length corresponding to or larger or shorter than six times the length of the component of each nozzle row 28 in the sub-scanning direction Y, to shift the main scanning position of the ink jet head 22 by the predetermined distance.

Figure 13:
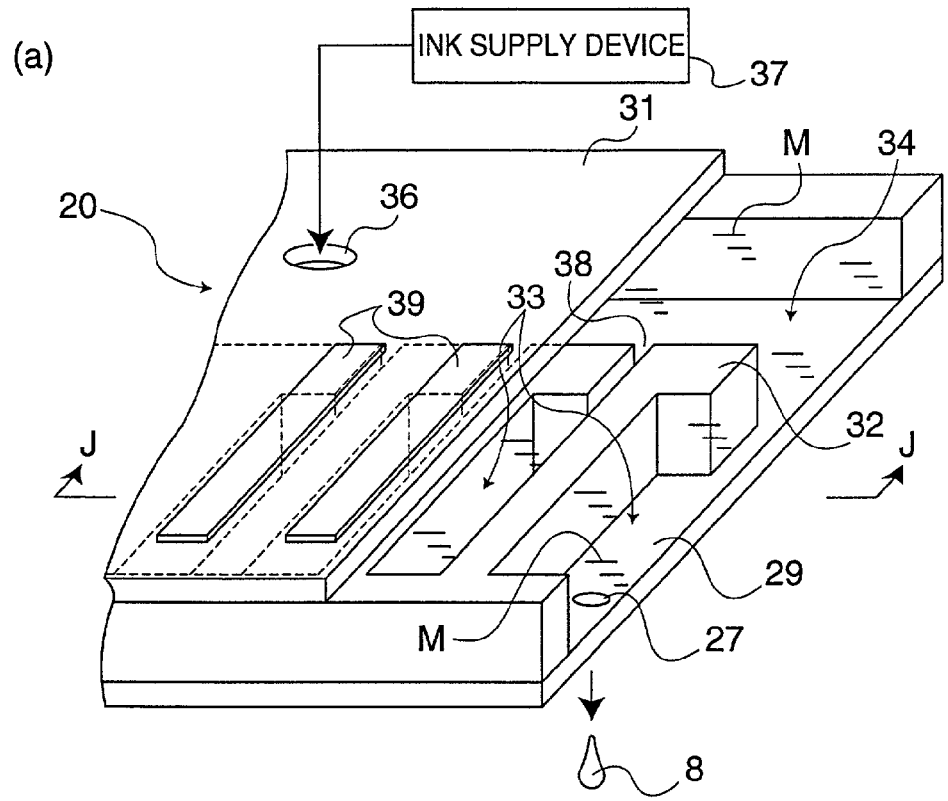
Figure 13:
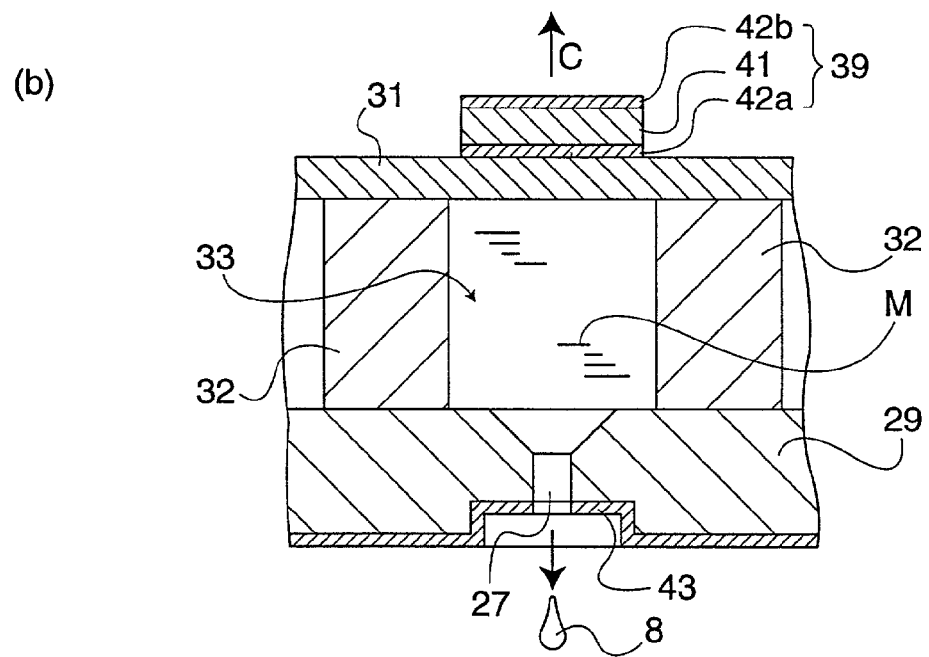

Each of the heads 20 has an internal structure, for example, shown in FIGS. 13(*a*) and 13(*b*). Specifically, the head 20 includes a stainless steel nozzle plate 29, a vibrating plate 31 opposed to the nozzle plate 29, and a plurality of partition members 32 for connecting the nozzle plate 29 and the vibrating plate 31. The partition members 32 form a plurality of ink chambers 33 and a liquid reservoir 34 between the nozzle plate 29 and the vibrating plate 31. The plurality of the ink chambers 33 communicate with the liquid reservoir 34 through passages 38.

Also, an ink supply hole 36 can be formed at a proper position of the vibrating plate 31, and an ink supply device 37 is connected to the ink supply hole 36. The ink supply device 37 supplies the filter element material M of one of the R, G and B colors, for example, R color, to the ink supply hole 36. The supplied filter element material M is stored in the liquid reservoir 34, and is further passed through the passages 38 to fill the ink chambers 33.

The nozzle plate 29 includes the nozzles 27 for jetting the filter element material M from the ink chambers 33. Furthermore, ink pressing members 39 are provided on the back of the vibrating plate 31, which is opposite to the side forming the ink chambers 33, corresponding to the ink chambers 33. Each of the ink pressing members 39 can further include a piezoelectric element 41, and a pair of electrodes 42*a* and 42*b* which hold the piezoelectric element 41 therebetween, as shown in FIG. 13(*b*). The piezoelectric element 41 is deformed to project outward by electricity supplied to the electrodes 42*a* and 42*b*, as shown by an arrow C, increasing the volume of the corresponding ink chamber 33. As a result, an amount of the filter element material M corresponding to the increase in volume flows into the ink chamber 33 from the liquid reservoir 34 through the passage 38.

When electrification of the piezoelectric element 41 is stopped, both the piezoelectric element 41 and the vibrating plate 31 return to the initial shapes. As a result, the ink chamber 33 also returns to the initial volume to increase the pressure of the filter element material M in the ink chamber 33, thereby ejecting the filter element M as droplets 8 to the mother board 12 (refer to FIG. 6(*b*)) from the nozzle 27. In addition, a waste ink layer 43 having, for example, a Ni-tetrafluoroethylene eutectoid plated layer is provided around the nozzle 27, for preventing a bend of the flying droplets 8, clogging of the nozzle 27, etc.

Figure 10:
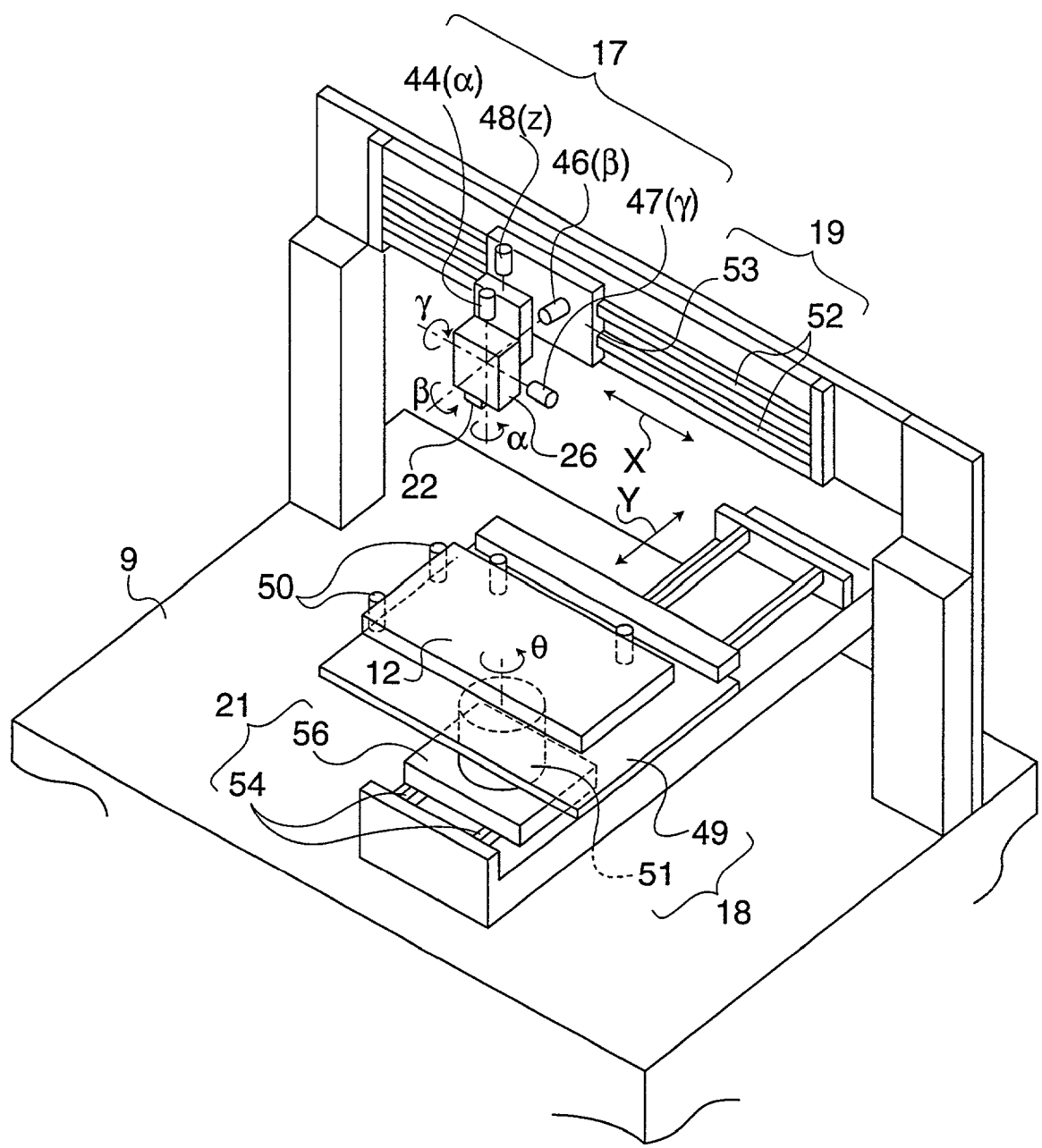
FIG. 10 is an enlarged perspective view showing a main portion of the apparatus shown in FIG. 9.

In FIG. 10, the head position control device 17 can include a α motor 44 for rotating the ink jet head 22 in a plane, a β motor 46 for oscillating and rotating the ink jet head 22 around an axis parallel to the sub-scanning line Y, a γ motor 47 for oscillating and rotating the ink jet head 22 around an axis parallel to the main scanning line X, and a Z motor 48 for moving the ink jet head 22 in parallel to the vertical direction.

In FIG. 10, the board position control device 18 shown in FIG. 9 includes a table 49 on which the mother board 12 is mounted, and a θ motor 51 for rotating the table 49 in a plane as shown by arrow θ. The main scanning driving device 19 shown in FIG. 9 can include a guide rail 52 extending in the main scanning direction X, and a slider 53 containing a pulse-driven linear motor. When the linear motor is operated, the slider 53 is moved in parallel to the main scanning direction along the guide rail 52.

In FIG. 10, the sub-scanning driving device 21 shown in FIG. 9 has a guide rail 54 extending in the sub-scanning direction Y, and a slider 56 containing a pulse-driven linear motor. When the linear motor is operated, the slider 56 is moved in parallel to the sub-scanning direction Y along the guide rail 54.

The pulse-driven linear motor contained in each of the slider 53 and the slider 56 can precisely control the rotational angle of the output shaft by a pulse signal supplied to the motor, thereby precisely controlling the position of the ink jet head 22 supported by the slider 53 on the main scanning direction X, the position of the table 49 on the sub-scanning direction, and the like. It is to be understood that the position control of the ink jet head 22 and the table 49 is not limited to the method using a pulse motor, and the position control can also be realized by a feedback control method using a servo motor, or any other control method.

The board supply device 23 shown in FIG. 9 includes a board receiving unit 57 that receives the mother board 12, and a robot 58 for transferring the mother board 12. The robot 58 comprises a base 59 installed on an installation plane such as a floor, the ground, or the like, an elevating shaft 61 which moves up and down relative to the base 59, a first arm 62 rotating around the elevating shaft 61, a second arm 63 rotating relative to the first arm 62, a suction pad 64 provided at the bottom of the tip of the second arm 63. The suction pad 64 can attract the mother board 12 by air suction, or the like.

In FIG. 9, a capping device 76 and a cleaning device 77 are disposed on one side of the sub-scanning driving device 21 in the locus of the ink jet head 22 driven by the main scanning driving device 19 for main scanning. Also, an electronic balance 78 is disposed on the other side. The cleaning device 77 is a device for cleaning the ink jet head 22. The electronic balance 78 is a device for measuring the weight of the ink droplets discharged from each of the nozzles 27 (refer to FIG. 11) of the ink jet head 22. The capping device 76 is a device for preventing the nozzles 27 (refer to FIG. 11) from being dried when the ink jet head 22 is in a standby state.

Furthermore, a head camera 81 is disposed near the ink jet head 22 so as to move together with the ink jet head 22. A board camera 82 supported by a supporting device (not shown in the drawing) provided on the base 9 is disposed at position where the mother board 12 can be photographed.

The control device 24 shown in FIG. 9 can include a computer body 66 containing a processor, a keyboard 67 serving as an input device, and a CRT (Cathode Ray Tube) display 68 serving as a display device. The processor has a CPU (Central Processing Unit) 69 for arithmetic processing, and a memory, i.e., an information storage medium 71, for storing various items of information.

Figure 14:
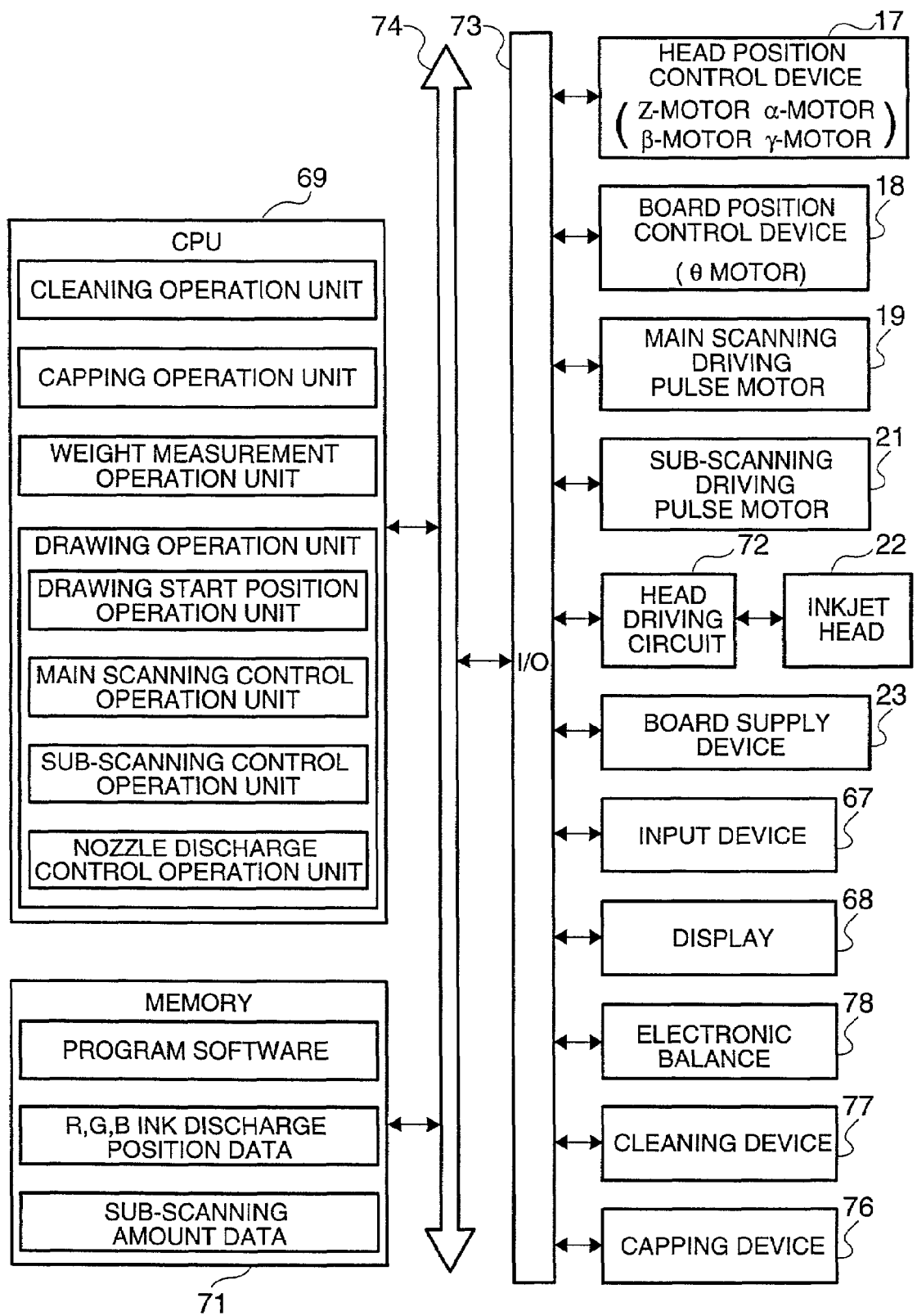
FIG. 14 is a block diagram showing en electric control system used in the ink jet head apparatus shown in FIG. 9.

The head position control device 17, the board position control device 18, the main scanning driving device 19, the sub-scanning driving device 21, and a head driving circuit 72 that drives the piezoelectric elements 41 (refer to FIG. 13(b)) in the ink jet head 22 are connected to the CPU 69 through an input/output interface 73 and a bus 74, as shown in FIG. 14. The board supply device 23, the input device 67, the display 68, the electronic balance 78, the cleaning device 77 and the capping device 76 are also connected to the CPU 69 through the input/output interface 73 and the bus 74.

The memory 71 is a concept including semiconductor memory such as RAM (Random Access Memory), ROM (Read Only Memory), and the like, external storage devices such as a hard disk, a CD-ROM reader, a disk-type storage medium, and the like. Functionally, there are set a storage area for storing a program software in which the control procedure for operation of the ink jet apparatus 16 is written, a storage area for storing, as coordinate data, the discharge positions of one (for example, R color) of R, G and B in the mother board 12 in order to realize the various RGB arrangements shown in FIG. 8, a storage area for storing an amount of sub-scanning of the mother board 12 in the sub-scanning direction Y shown in FIG. 10, areas functioning as a work area and a temporary file for the CPU 69, and other various areas.

The CPU 69 controls the discharge of ink, i.e., the filter element material, at predetermined positions on the surface of the mother board 12 according to the program software stored in the memory 71, and the specific function realizing units include a cleaning operation unit for executing an arithmetic operation for realizing a cleaning process, a capping operation unit for realizing a capping process, a weight measurement operation unit for executing an arithmetic operation for realizing weight measurement using the electronic balance 78 (refer to FIG. 9), and a drawing operation unit for executing an arithmetic operation for drawing a pattern of the filter element material by ink jet.

More specifically, the drawing operation unit is divided into various functional operation units such as a drawing start position operation unit for setting the ink jet head 22 at the initial position for drawing, the main scanning control operation unit for executing an arithmetic operation of control for moving the ink jet head 22 in the main scanning direction X at a predetermined speed, a sub-scanning control operation unit for executing an arithmetic operation of control for shifting the mother board 12 in the sub-scanning direction Y by a predetermined amount of sub-scanning, a nozzle discharge control operation unit for executing an arithmetic operation of control for determining which nozzle of the plurality of nozzles 27 of the ink jet head 22 is operated to discharge ink, i.e., the filter element material, etc.

In this embodiment, each of the above-descried functions is realized by using the CPU 69 based on the software. However, when each of the functions can be realized by a single electronic circuit without using the CPU, such an electronic circuit can be used.

The operation of the ink jet apparatus 16 having the above-described configuration will be described below based on the flowchart shown in FIG. 15. When an operator turns on a power supply to start the ink jet apparatus 16, initial setting is first executed in Step S1. Specifically, the head unit 26, the board supply device 23, the control device 24, etc. are set in the predetermined initial state.

Next, when a weight measurement time comes ("YES" in Step S2), the head unit 26 is moved to the electronic balance 78 shown in FIG. 9 by the main scanning driving device 19 (Step S3) to measure the weight of the ink discharged from each of the nozzles 27 by using the electronic balance 78 (Step S4). Therefore, the voltage applied to the piezoelectric element 41 corresponding to each of the nozzles 27 is controlled according to the ink discharge properties of the nozzles 27 (Step S5).

Next, when a cleaning time comes ("YES" in Step S6), the head unit 26 is moved to the cleaning device 77 by the main scanning driving device 19 (Step S7) to clean the ink jet head 22 by the cleaning device 77 (Step S8).

When it is neither weight measurement time nor cleaning time (i.e., "NO" in Steps S2 and S6), or when these processes are finished, the board supply device 23 shown in FIG. 9 is operated to supply the mother board 12 to the table 49 in Step S9. Specifically, the mother board 12 received in the board receiving unit 57 is suctionally held by the suction pad 64, and then the elevating shaft 61, the first arm 62 and the second arm 63 are moved to transfer the mother board 12 to the table 49. Furthermore, the mother board 12 is pressed on positioning pins (refer to FIG. 10) provided in advance at proper positions of the table 49. In order to prevent a positional deviation of the mother board 12 on the table 49, the mother board 12 is preferably fixed to the table 49 by an air suction device or the like.

Next, the output shaft of the θ motor 51 shown in FIG. 10 is rotated by a small angular unit to rotate the table 49 by a small angular unit in a plane and position the mother board 12 while observing the mother board 12 with the board camera 82 shown in FIG. 9 (Step S10). Next, the start position of drawing by the ink jet head 22 is determined by an arithmetic operation while observing the mother board 12 by the head camera 81 shown in FIG. 9 (Step S11), and then the main scanning driving device 19 and the sub-scanning driving device 21 are appropriately operated to move the ink jet head 22 to the drawing start position (Step S12).

At the same time, the ink jet head 22 is set so that the axis line K1 of the carriage 25 is perpendicular to the main scanning direction X, as shown in FIG. 1. Therefore, the nozzle rows 28 are arranged obliquely at an angle θ with the sub-scanning direction Y of the ink jet head 22. This is a method for geometrically coinciding the dimensional component of the nozzle pitch in the sub-scanning direction Y with the element pitch when the ink jet head 22 is moved in the main scanning direction X. This is because in a general ink jet apparatus, the nozzle pitch corresponding to the distance between the adjacent nozzles 27 is frequently different from the element pitch corresponding to the distance between the adjacent filter elements 3, i.e., the adjacent filter element formation areas 7.

Figure 15:
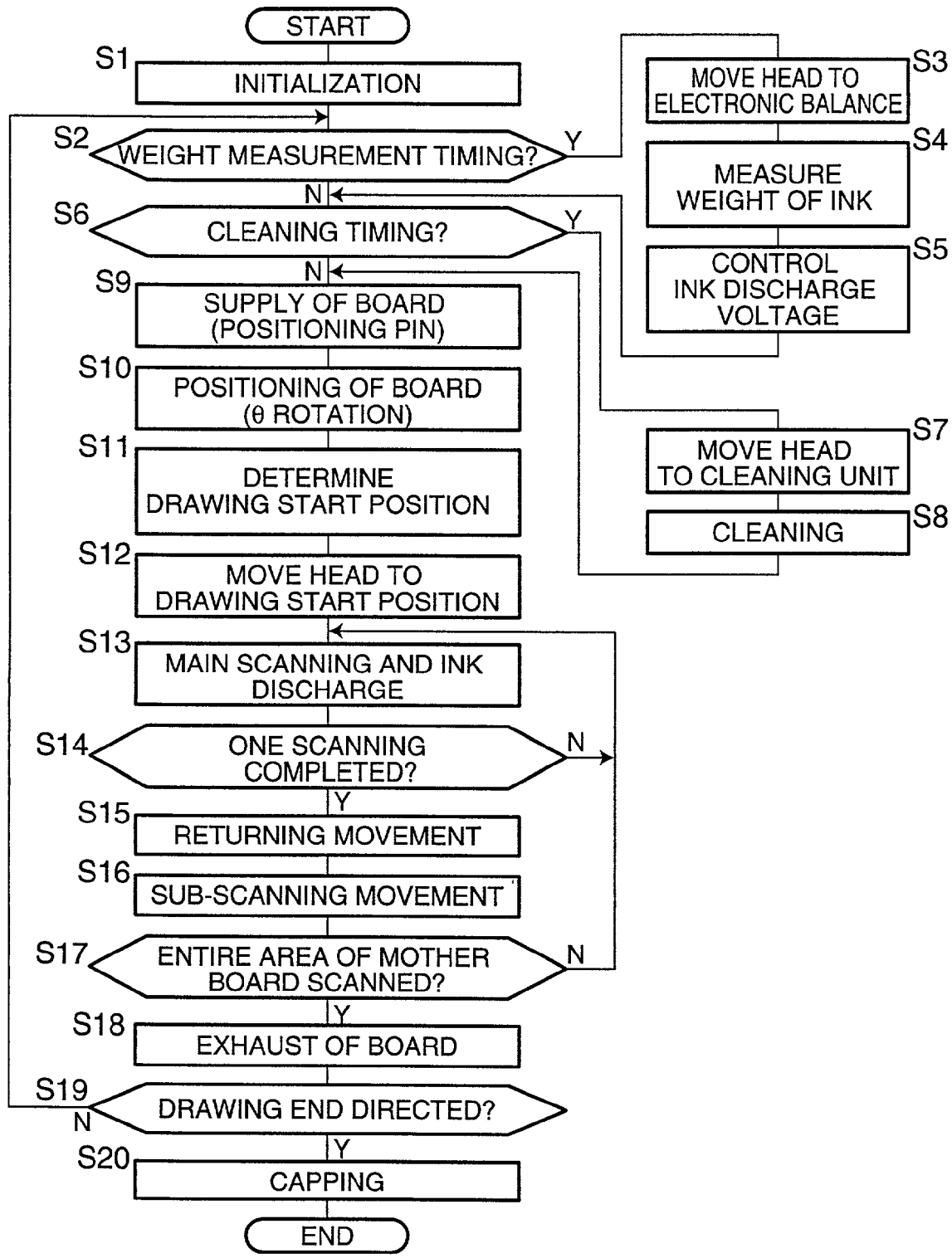
FIG. 15 is a flowchart showing a flow of control executed by the control system shown in FIG. 14.

When the ink jet head 22 is set at the drawing start position in Step S12 shown in FIG. 15, main scanning is started in the main scanning direction X in Step S13, and at the same time, discharge of ink is started. More specifically, the main scanning driving device 19 shown in FIG. 10 is operated to linearly move the ink jet head 22 in the main scanning direction X shown in FIG. 1 at a constant speed. When the nozzle 27 reaches the corresponding filter element formation area 7 to which ink should be supplied during movement, the ink, i.e., the filter element material, is discharged from the nozzle 27 to fill the area 7, forming the filter element 3.

When one time of main scanning is completed for the mother board 12 ("YES" in Step S14), the ink jet head 22 returns to the initial position by reverse movement (Step S15). Furthermore, the ink jet head 22 is driven to be moved by the sub-scanning driving device 21 by the predetermined amount of sub-scanning in the sub-scanning direction Y, for example, an amount corresponding to the component of the total length of the six nozzle rows 28 in the sub-scanning direction Y (Step S16). Then main-scanning and ink discharge are repeated to fill the filter element formation areas 7 with the filter element material, forming the filter elements 3 (Step S13).

When the operation of drawing the pattern of the filter elements 3 with the ink jet head 22 is completed for the entire area of the mother board 12, as described above ("YES" in Step S17), the mother board 12 after processing is exhausted to the outside by the board supply device 23 or another transfer device in Step S18.

Then, the process returns to Step S2 in which the operation of discharging ink of any one of colors R, G and B is repeated for another mother board 12 unless the end of processing is directed by the operator ("NO" in Step S1).

When the operation end is directed by the operator ("YES" in Step S19), the CPU 69 transfers the ink jet head 22 shown in FIG. 9 to the capping device 76 which executes capping of the ink jet head 22 (Step S20).

After patterning of one of the three colors of R, G and B, for example, R color, which constitute the color filter, is completed, the mother board 12 is transferred to the ink jet apparatus 16 using the second color of the R, G and B colors, for example, G color, as a filter element material, to perform patterning of the G color, and finally transferred to the ink jet apparatus 16 using the third color of the R, G and B colors, for example, B color, as a filter element material, to perform patterning of the B color. As a result, the mother board 12 is produced, in which a plurality of the color filters 1 (FIG. 6(a)) having the desired RGB dot arrangement such as the stripe arrangement, or the like are formed. The mother board 12 is cut for each color filter area 11 to produce a plurality of color filters 1.

In order to use the color filter 1 for a color display of a liquid crystal device, an electrode, an alignment film, etc. are further laminated on the surface of the color filter 1. In this case, when the mother board 12 is cut into the respective color filters 1 before the electrode, the alignment film, etc. are laminated, the subsequent steps of forming the electrode, etc. can be very difficult. Therefore, in this case, the mother board 12 is preferably cut after the necessary addition steps of forming the electrode, the alignment film, etc. are completed, not immediately after the color filters 1 are completed on the mother board 12.

As described above, in the method and apparatus for producing a color filter of this embodiment, during main scanning of the substrate 12 with the carriage 25 as supporting device that supports the plurality of heads 20 as shown in FIG. 1, ink is discharged from the nozzle rows 28 of the plurality of heads 20. Therefore, the scanning time can be shortened, as compared with scanning of the surface of the substrate 12 with a single head, thereby shortening the time required for producing a color filter.

Also, since main scanning is performed with the heads 20 each of which is inclined at an angle θ with the sub-scanning direction Y, the nozzle pitch of the plurality of nozzles 27 belonging to each of the heads 20 can be coincided with the distance between the filter element formation areas 7, i.e., the element pitch, on the substrate 12. When the nozzle pitch is geometrically coincided with the element pitch, it is advantageous in that the positions of the nozzle rows 28 need not be controlled in the sub-scanning direction Y.

In this embodiment, the heads 20 are fixed to the carriage 25, and thus one inclination angle θ is set for one carriage 25. Therefore, in case that the element pitch of the substrate 12 varies, another carriage 25 must be used for realizing the inclination angle θ corresponding to the element pitch.

In this embodiment, since the each of the heads 20 is inclined, not the entire carriage 25, the distance T between the nozzle 27 closest to the substrate 12 and the nozzle 27 far from the substrate 12 is shorter than the case in which the entire carriage 25 is inclined, thereby remarkably shortening the scanning time of the substrate 12 with the ink jet head 22. Therefore, the time required for producing a color filter can be shortened.

In the production apparatus and method of this embodiment, the filter elements 3 are formed by discharging ink from the ink jet head 22, and thus has no need to pass through such a complicated step as a method using a photolithography process, and causes no waste of materials.

Although the first embodiment uses the non-transmissive resin material as the partition 6, a light transmitting resin material can also be used as the partition 6. In this case, a light shielding metal film or resin material may be provided at the positions corresponding to the spaces between the respective filter elements, for example, above or below the partition 6, to form a black mask. Alternatively, the partition 6 made of a transmissive resin material may be formed without the black mask being provided.

It should be understood that although the first embodiment uses the filter elements of R, G and B, of course, the filter elements are not limited to R, G and B, and for example, C (cyan), M (magenta), and Y (yellow) may be used. In this case, filter element materials having C, M and Y colors may be used in place of the filter element materials of R, G and B without departing from the spirit and scope of the present invention.

Figure 3:
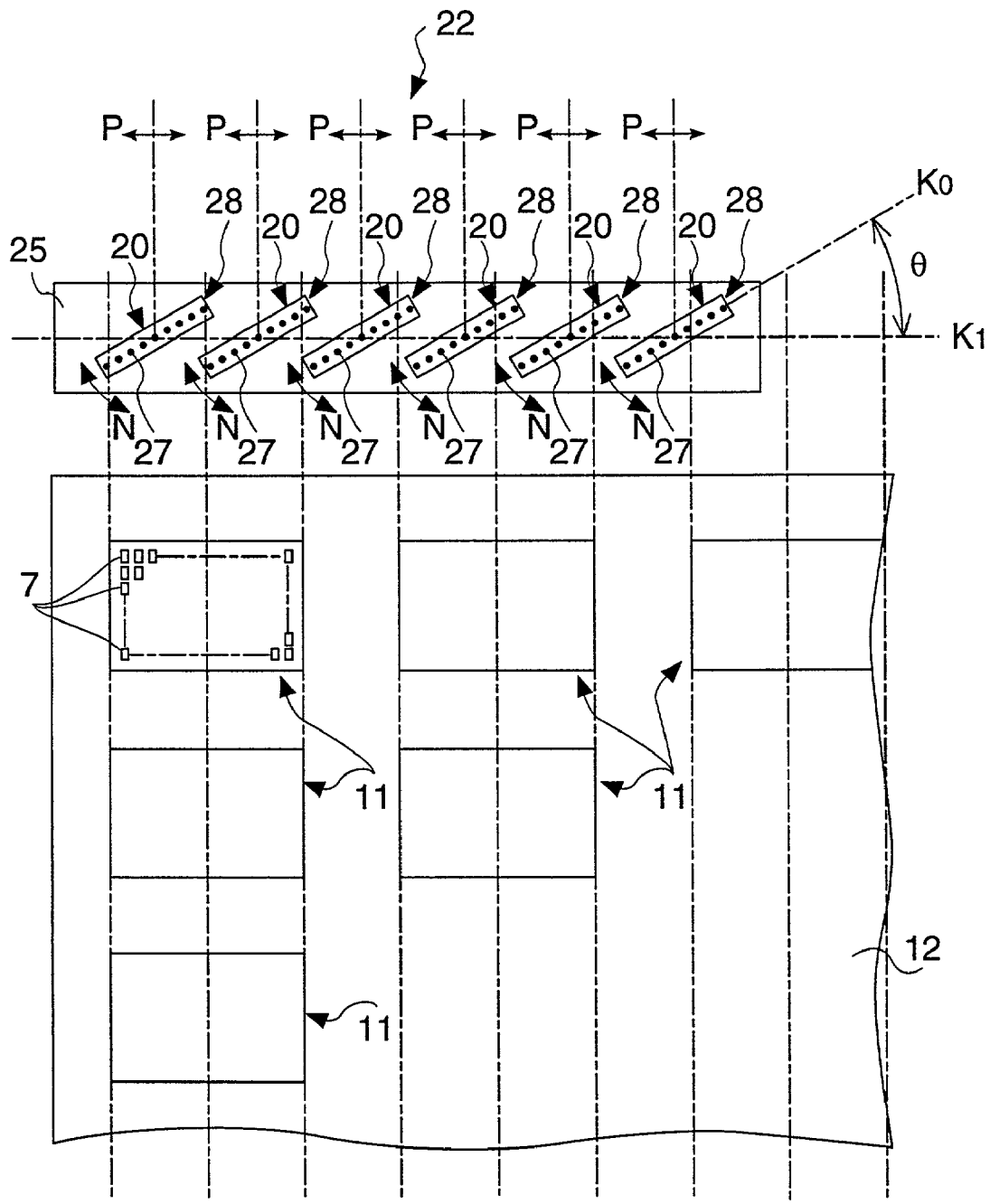
FIG. 3 is a plan view of schematically showing a main step of a production method using an apparatus for producing a color filter according to another embodiment of the present invention.

FIG. 3 schematically shows a case in which ink, i.e., a filter element material, is discharged into each of the filter element formation areas 7 in the color filter formation areas 11 of the mother board 12 from the ink jet head 22 by a method and apparatus for producing a color filter according to another embodiment of the present invention.

The outlines of the steps performed in this embodiment are the same as those shown in FIG. 7, and the ink jet apparatus used for discharging ink is also mechanically the same as the apparatus shown in FIG. 9.

Figure 4:
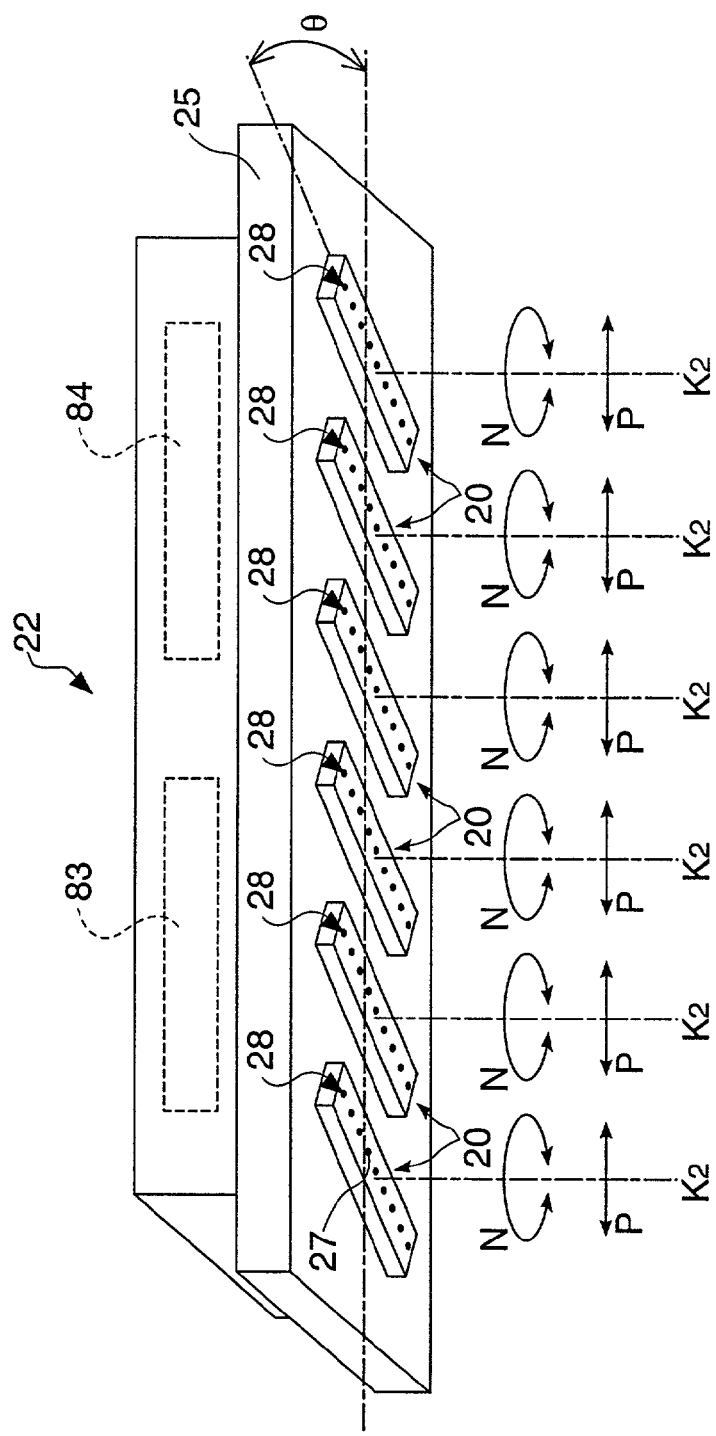
FIG. 4 is a perspective view of the ink jet head shown in FIG. 3.

This embodiment is different from the embodiment shown in FIG. 1 in that the structure for supporting the heads 20 by the carriage 25 is changed. Specifically, as shown in FIG. 4, each of the heads 20 is supported by the carriage 25 so as to be rotatable around the axis line K2 of the head 20, i.e., rotatable in a plane, as shown by an arrow N. Each of the heads 20 is also supported by the carriage 25 so as to be slidable, i.e., movable parallel in a plane, as shown by arrow P. Furthermore, the carriage 25 is provided with a nozzle row angle control device 83 and a nozzle row spacing control device 84.

The nozzle row angle control device 83 individually or collectively controls the in-plane inclination angles $\theta$ of the plurality of nozzle rows 28. The nozzle row angle control device 83 can be formed by any desired structure, for example, a structure in which the heads 20 mounted on the casing 25 so as to be rotatable in a plane as shown by arrow N are connected to a power source such as a pulse motor, a servo motor, or the like, which can control the rotational angle, directly or indirectly through a power transmission mechanism, etc. In this structure, the inclination angle $\theta$ of each of the nozzle rows 28 can be controlled to a desired value by controlling the output angle value of the power source, and the inclination angle $\theta$ of each nozzle row 28 can be kept at the desired value by holding the output shaft of the power source in a lock state after the angle is controlled.

The nozzle row spacing control device 84 individually or collectively controls the spacing between the plurality of nozzle rows 28. The nozzle row spacing control device 84 can be formed by any desired structure, for example, a structure in which the heads 20 mounted on the casing 25 so as to be slidable as shown by arrow P are connected to a slide driving device comprising as a power source a rotating device such as a pulse motor, a servo motor, or the like, which can control the rotational angle, or a slide driving device comprising a linear driving power source such as a linear motor or the like.

In this embodiment, the nozzle row angle control device 83 shown in FIG. 4 can be operated to rotate the heads 20 in a plane as shown by arrow N in FIG. 3 to control the in-plane inclination angle $\theta$ of each of the heads 20 so that the nozzle pitch of the nozzle rows 28 coincides with the element pitch of the filter element formation areas 7 on the substrate 12. Furthermore, the nozzle row spacing control device 84 can be operated to control the spacing between the heads shown in FIG. 3 so that the nozzle distance between the ends of the adjacent nozzle rows 28 coincides with the element pitch on the substrate 12.

Therefore, a continuous long nozzle row having six nozzle rows 28 and having a nozzle pitch coinciding with the element pitch can be formed. In this embodiment, the nozzle pitch of one ink jet head 22 is appropriately controlled to draw a pattern having different element pitches on the substrate.

Figure 5:
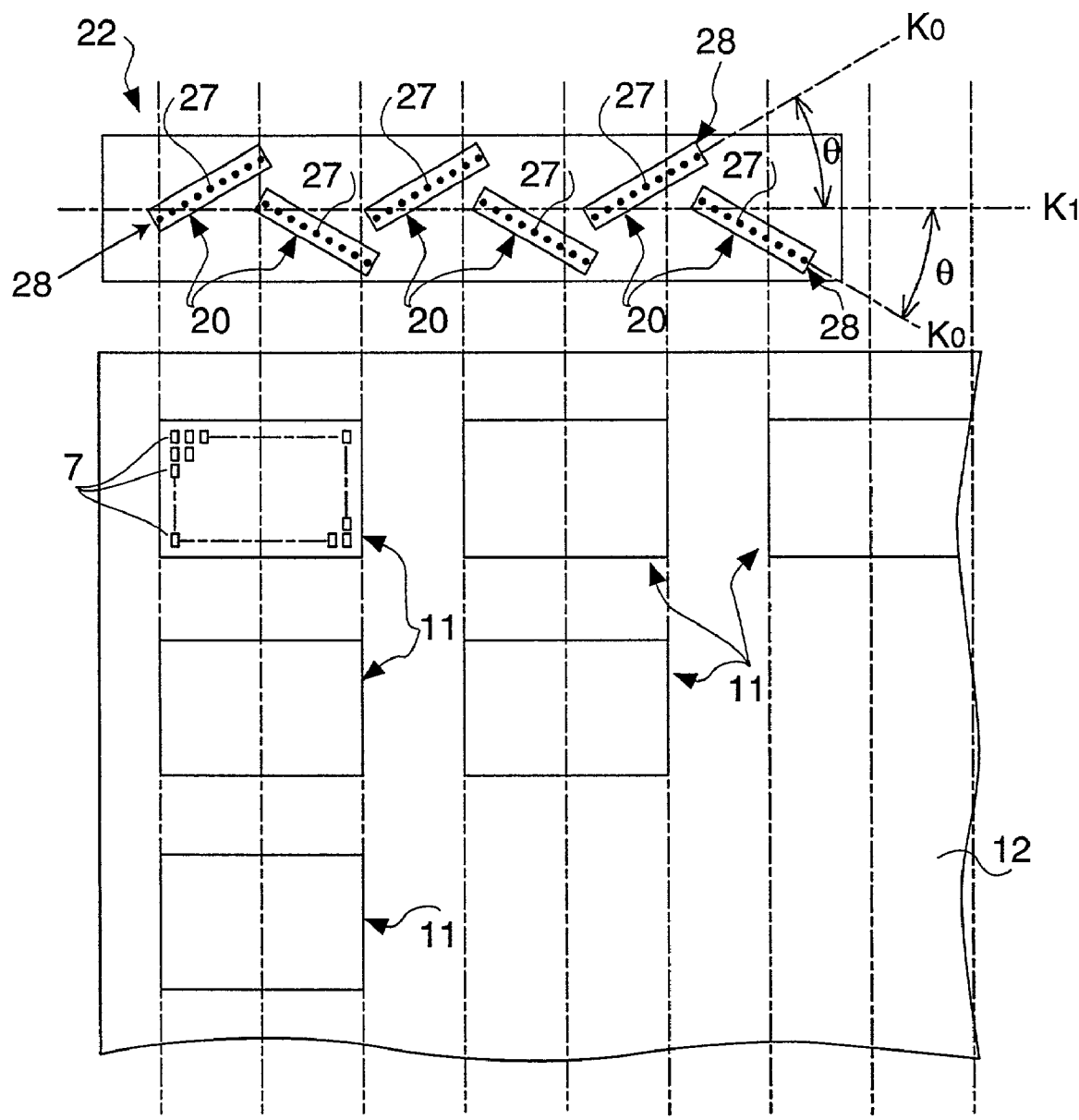
FIG. 5 is a plan view of schematically showing a main step of a production method using an apparatus for producing a color filter according to still another embodiment of the present invention.

FIG. 5 schematically shows an example in which ink, i.e., a filter element material, is discharged to each of the filter element formation areas 7 in the color filter formation areas 11 of the mother board 12 from the ink jet head 22 by a method and apparatus for producing a color filter according to still another embodiment of the present invention. The outlines of the steps performed in this embodiment are the same as these shown in FIG. 7, and the ink jet apparatus used for discharging ink is also mechanically the same as the apparatus shown in FIG. 9.

This embodiment is different from the embodiments shown in FIGS. 1 and 3 in that the inclination angles $\theta$ of the nozzle rows 28 are the same in magnitude, but alternately change in direction between the plus and minus directions. This method can also form a continuous long nozzle row having six nozzle rows 28 and having a nozzle pitch coinciding with the element pitch on the substrate 12.

This embodiment can be formed in a structure in which the nozzle rows 28 are fixed, as shown in FIG. 1, or a structure in which the inclination angles $\theta$ and nozzle row spacing between the nozzle rows can be controlled, as shown in FIG. 3.

Figure 12:
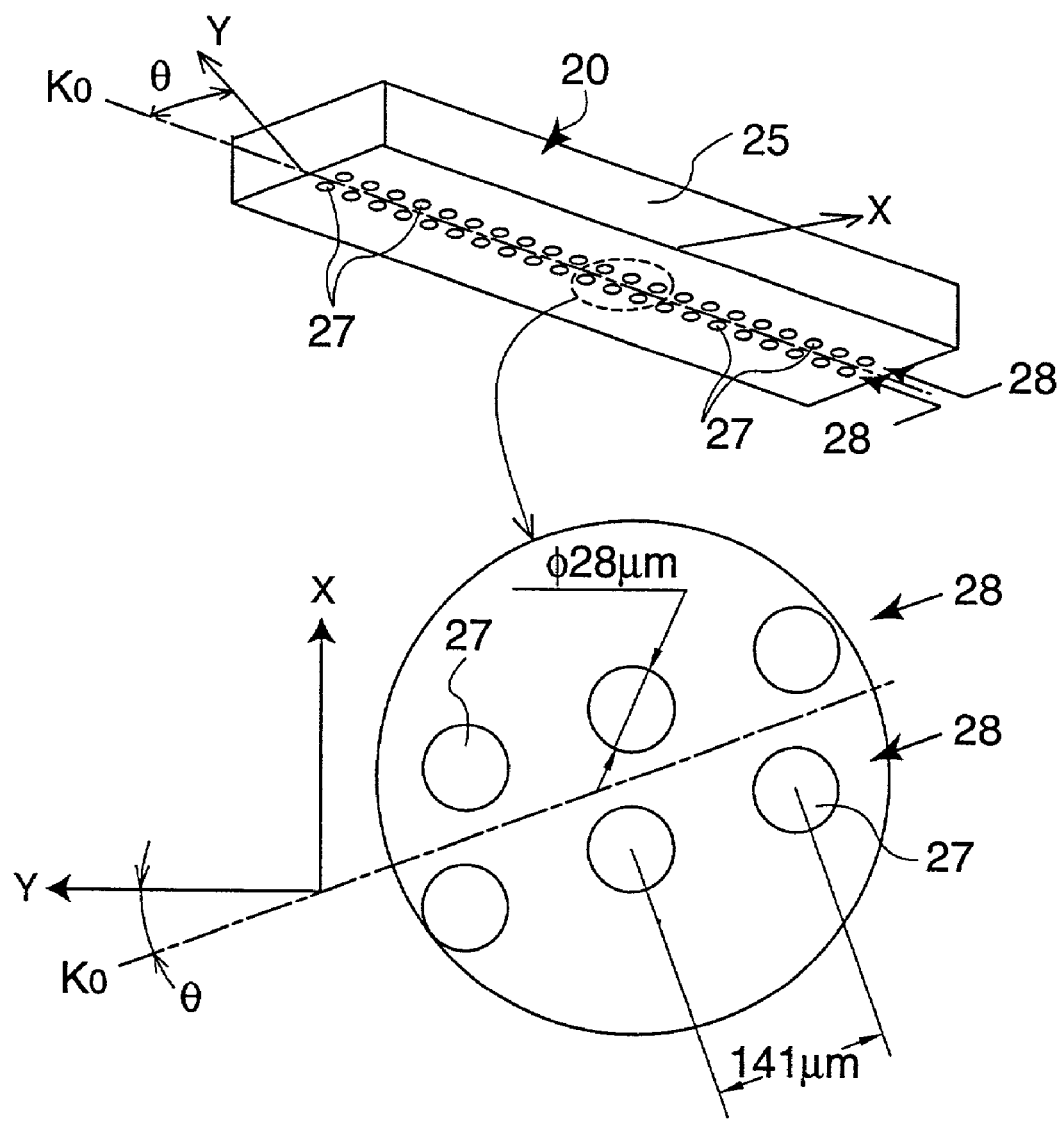
FIG. 12 is a perspective view showing a modified example of a head.

FIG. 12 shows a modified example of the head 20 used in the present invention. The head 20 shown in FIG. 12 is different from the head 20 shown in FIG. 11 in that two nozzle rows 28 are provided in the main scanning direction X. This can supply the filter element material to one filter element formation area 7 from two nozzles 27 formed on the same main scanning line.

In this embodiment, the axis line K0 of the ink jet head 22 is inclined at an in-plane inclination angle $\theta$ relative to the sub-scanning direction Y. Therefore, the nozzles 27 in the two nozzle rows 28 are preferably arranged to be shifted to the main scanning direction X, if seen from carriage 25, not arranged perpendicularly to the axis line K0.

Figure 16:
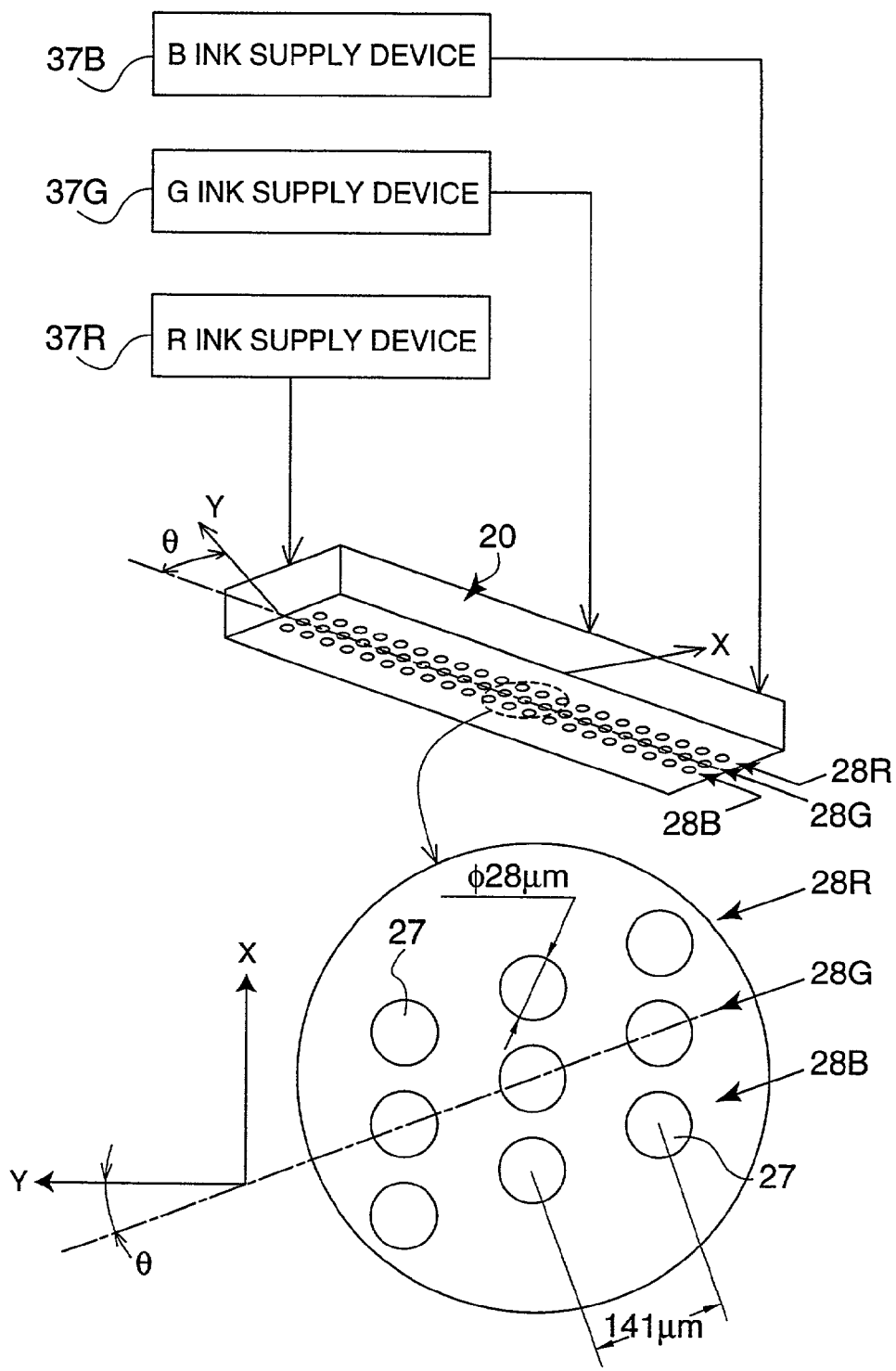
FIG. 16 is a perspective view showing another modified example of a head.

FIG. 16 shows a further modified example of the head 20 used in the present invention. The head 20 shown in FIG. 16 is different from the head 20 shown in FIG. 11 in that three nozzle rows including a nozzle row 28R for discharging R color ink, a nozzle row 28G for discharging G color ink and a nozzle row 28B for discharging B color ink are formed in the head 20, and the ink discharge system shown in FIGS. 13(a) and 13(b) is provided for each of the three nozzle rows. Furthermore, a R ink supply device 37R is connected to the ink discharge system corresponding to the R color nozzle row 28R; a G ink supply device 37G is connected to the ink discharge system corresponding to the G color nozzle row 28G; and a B ink supply device 37B is connected to the ink discharge system corresponding to the B color nozzle row 28B.

The outlines of the steps performed in this embodiment are similar to those shown in FIG. 7, and the ink jet apparatus used for discharging ink is also mechanically the same as the apparatus shown in FIG. 9.

In the embodiment shown in FIG. 11, one nozzle row 28 is provided on the head 20, and thus the ink jet heads 22 shown in FIG. 2 must be prepared for each of the three colors R, G and B for forming the color filter having three colors R, G and B. On the other hand, in use of the head 20 having the structure shown in FIG. 16, the three colors R, G and B can be simultaneously adhered by one main scanning with the ink jet head 22 having a plurality of heads 20 in the X direction, and thus only one ink jet head 22 may be prepared.

Figure 17:
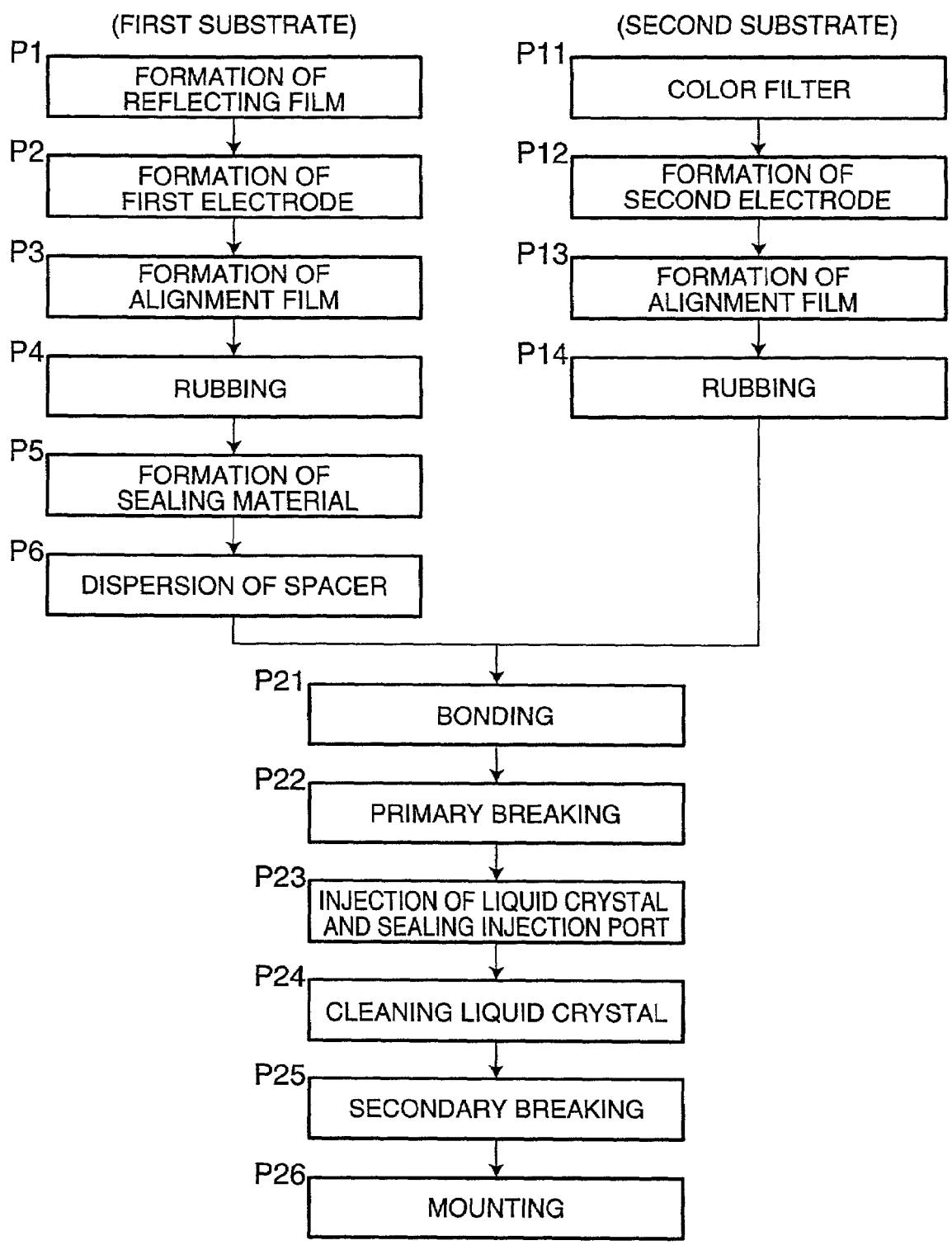
FIG. 17 is a drawing showing the steps of a method of manufacturing a liquid crystal device according to an embodiment of the present invention.
Figure 18:
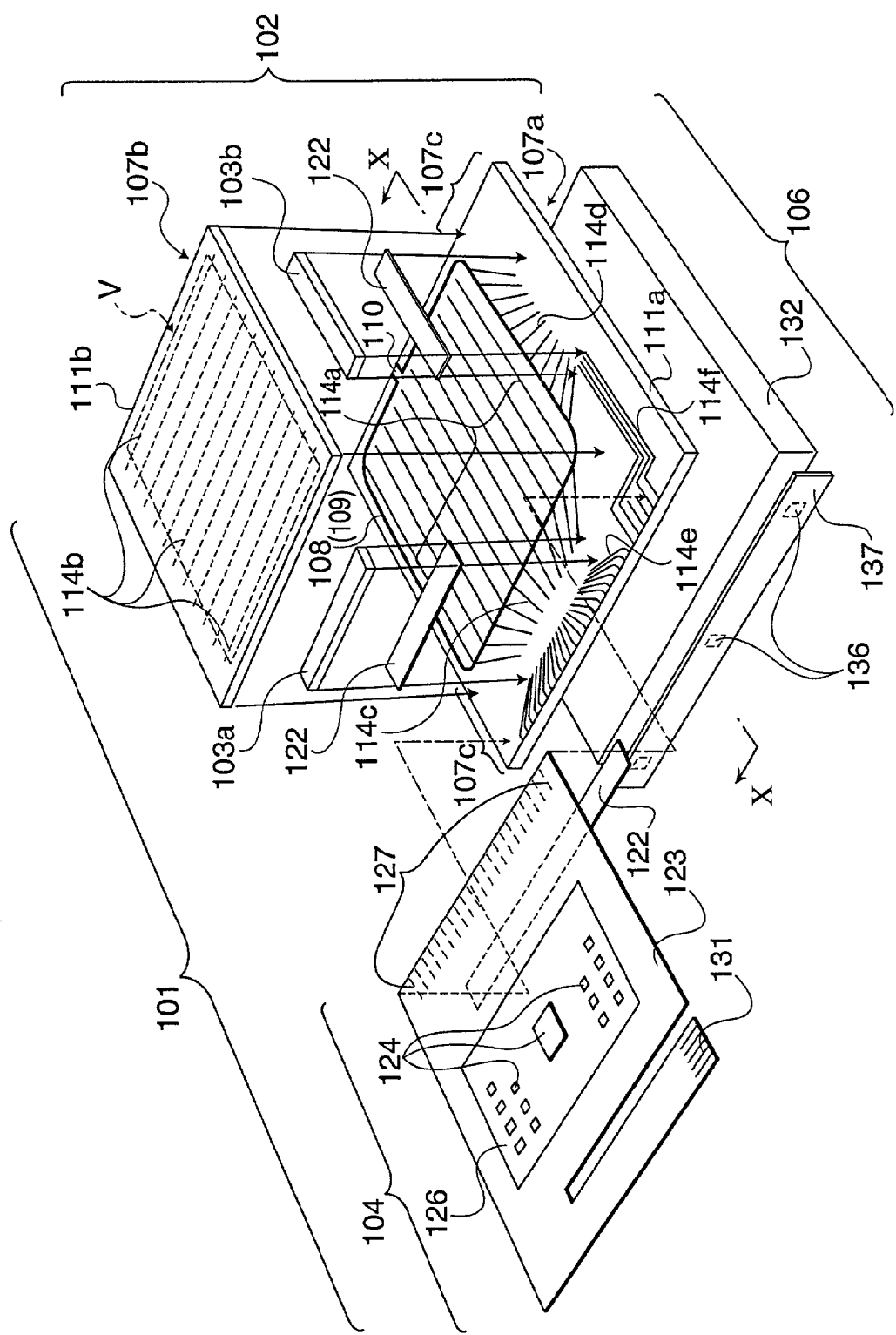
FIG. 18 is an exploded perspective view showing an example of a liquid crystal device manufactured by the method of manufacturing a liquid crystal device of the present invention.
Figure 19:
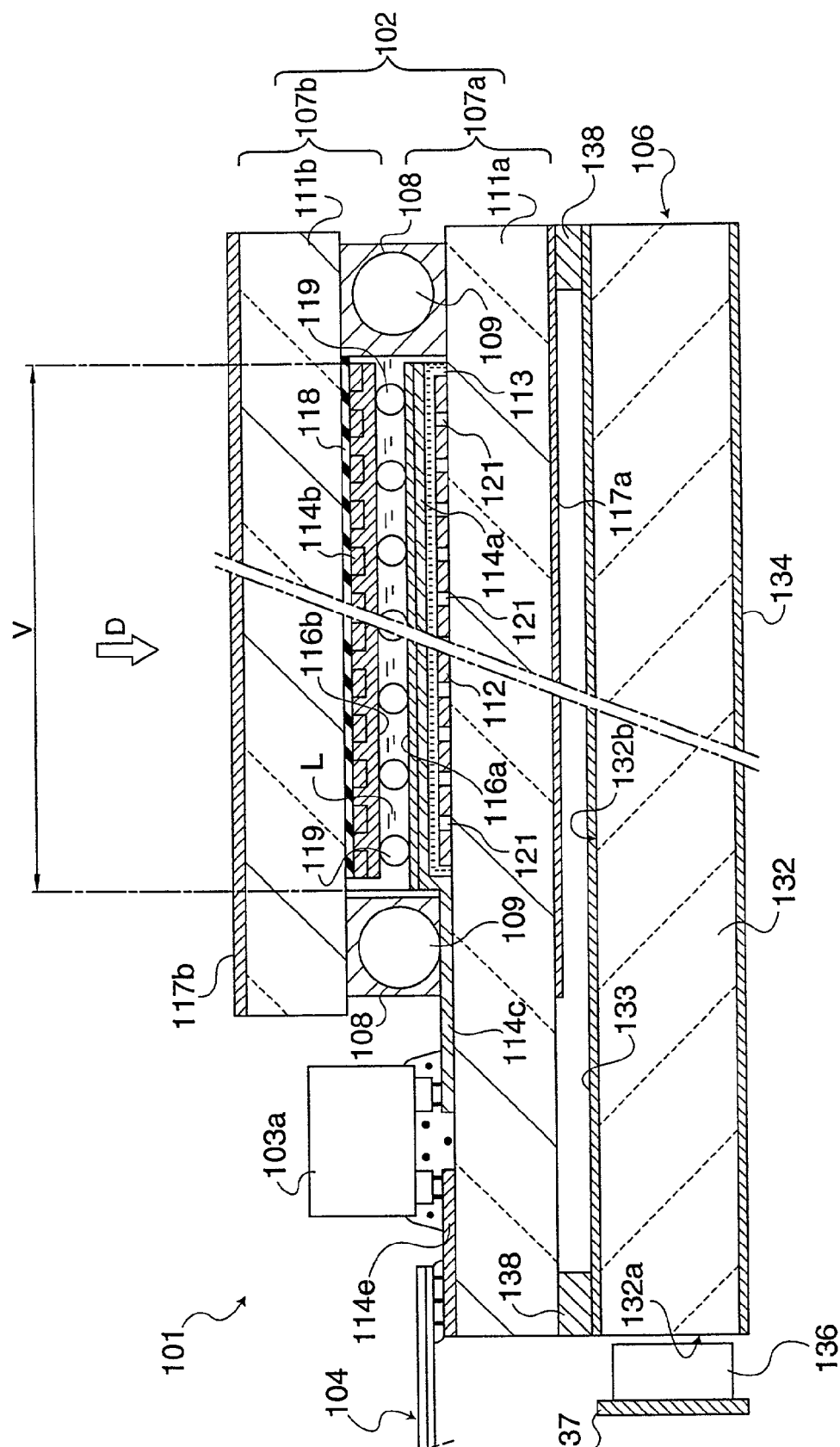
FIG. 19 is a sectional view showing the sectional structure of the liquid crystal device taken along line X—X in FIG. 18.

FIG. 17 shows a manufacturing method using an apparatus for manufacturing a liquid crystal device according to a further embodiment of the present invention. FIG. 18 shows a liquid crystal device manufactured by the manufacturing method according to a further embodiment of the present invention. FIG. 19 shows a sectional structure of the liquid crystal device taken along line X—X in FIG. 18. Before the method and apparatus for manufacturing a liquid crystal device are described, a liquid crystal device manufactured by the manufacturing method is described with reference to an example. The liquid crystal device of the embodiment is a transflective liquid crystal device which performs a full-color display in a single matrix system.

In FIG. 18, a liquid crystal device 101 includes a liquid crystal panel 102, liquid crystal driving ICs 103a and 103b mounted on the liquid crystal panel 102, a FPC (Flexible Printed Circuit) 104 connected as a wiring connection component to the liquid crystal panel 102, and an illumination device 106 provided as a back light on the back side of the liquid crystal panel 102.

The liquid crystal panel 102 is formed by bonding together a first substrate 107a and a second substrate 107b with a sealing material 108. The sealing material 108 is formed by circularly adhering an epoxy resin to the inner surface of the first substrate 107a or the second substrate 107b by, for example, screen printing or the like. The sealing material 108 contains a spherical or cylindrical conductor 109 dispersed therein and made of a conductive material, as shown in FIG. 19.

In FIG. 19, the first substrate 107a includes a plate-like substrate 111a made of transparent glass, transparent plastic, or the like. Also, a reflecting film 112 is formed on the inner surface (the upper surface shown in FIG. 19) of the substrate 111a, an insulating film 113 is laminated on the reflecting film 112, first electrodes 114a are formed in stripes (refer to FIG. 18) on the insulating film 113 as viewed from the direction of arrow D, and an alignment film 116a is formed on the first electrodes 114a. Furthermore, a polarizer plate 117a is mounted on the outer surface (the lower surface shown in FIG. 19) of the substrate 111a by bonding or the like.

Although, in FIG. 18, in order to make the arrangement of the first electrodes 114a easy to understand, the stripes of the first electrodes 114a are shown with larger spaces than the actual spaces, and in a smaller number than the actual number, more first electrodes 114a are actually formed on the substrate 111a.

In FIG. 19, the second substrate 107b includes a plate-like substrate 111b made of transparent glass, transparent plastic, or the like. Also, a color filter 118 is formed on the inner surface (the lower surface shown in FIG. 19) of the substrate 111b, second electrodes 114b are formed in stripes (refer to FIG. 18) perpendicularly to the first electrodes 114a as viewed from the direction of arrow D, and an alignment film 116b is formed on the second electrodes 114b. Furthermore, a polarizer plate 117b is mounted on the outer surface (the upper surface shown in FIG. 19) of the substrate 111b by bonding or the like.

Although, in FIG. 18, like the first electrodes 114a, in order to make the arrangement of the second electrodes 114b easy to understand, the stripes of the second electrodes 114b are shown with larger spaces than the actual spaces, and in a smaller number than the actual number, more second electrodes 114b are actually formed on the substrate 111a.

In FIG. 19, a liquid crystal, for example, a STN (Super Twisted Nematic) liquid crystal L, is sealed in the gap, i.e., the cell gap, surrounded by the first substrate 107a, the second substrate 107b and the sealing material 108. Many spherical small spacers 119 are dispersed on the inner surface of the first substrate 107a or the second substrate 107b so that the thickness of the cell gap is maintained by the spacers 119 present in the cell gap.

The first electrodes 114a and the second electrode 114b are arranged perpendicularly to each other, and the intersections are arranged in a dot matrix, as viewed from the direction of arrow D in FIG. 19. Each of the intersections of the dot matrix forms one picture element pixel. The color filter 118 can include components of the colors R (red), G (green) and B (blue), which are arranged in a predetermined pattern, for example, a stripe pattern, a delta pattern, or a mosaic pattern, as viewed from the direction of arrow D. Each of the picture element pixels corresponds to each of the colors R, G and B, and a unit of the picture element pixels of the three colors R, G and B forms a pixel.

The plurality of the picture element pixels, i.e., pixels, which are arranged in a dot matrix, are selectively illuminated to display an image of a character, a numeric character, or the like on the outside of the second substrate 107b of the liquid crystal panel 102. The area in which such an image is displayed is an effective pixel area which is shown in a planar rectangular area by an arrow V in FIGS. 18 and 19.

In FIG. 19, the reflecting film 112 is made of a light reflecting material such as an APC alloy, Al (aluminum), or the like, and an aperture 121 is formed at the position corresponding to each of the picture element pixels at the intersections of the first electrode 114a and the second electrodes 114b. Consequently, the apertures 121 are arranged in the same dot matrix as the picture element pixels, as viewed from the direction of arrow D in FIG. 19.

The first electrodes 114a and the second electrodes 114b are made of, for example, a transparent conductive material ITO. Each of the alignment films 116a and 116b is formed by adhering a polyimide resin in a film form having a uniform thickness. The alignment films 116a and 116b are rubbed to determine the initial orientation of the liquid crystal molecules on the surfaces of the first substrate 107a and the second substrate 107b.

In FIG. 18, the first substrate 107a is formed in a wider area than the second substrate 107b, and when both substrates are bonded together with the sealing material 108, the first substrate 107a has a substrate overhang 107c overhanging outward from the second substrate 107b. In addition, various types of wiring such as lead wiring 114c extending from the first electrodes 114a, lead wiring 114d connected to the second electrodes 114b on the second substrate 107b through the conductors 109 (refer to FIG. 19) present in the sealing material 108, metal wiring 114e connected to an input bump, i.e., an input terminal, of the liquid crystal driving IC 103a, metal wiring 114f connected to an input bump, i.e., an input terminal, of the liquid crystal driving IC 103b, etc. are formed in an appropriate pattern on the substrate overhang 107c.

In this embodiment, the lead wiring 114c extending from the first electrodes 114a and the lead wiring 114d connected to the second electrodes 114b are made of the same material ITO as the electrodes, i.e., a conductive oxide. The metal wirings 114e and 114f serving as input wirings of the liquid crystal driving ICs 103a and 103b are made of a metal material having a low electric resistance value, for example, an APC alloy. The APC alloy mainly contains Ag, and Pd and Cu as additive components, and is composed of 98% of Ag, 1% of Pd, and 1% of Cu.

The liquid crystal driving ICs 103a and 103b are mounted on the surface of the substrate overhang 107c by bonding with an ACF (Anisotropic Conductive Film) 122. Namely, in this embodiment, the liquid crystal panel is a so-called COG (Chip On Glass) type liquid crystal panel having a structure in which a semiconductor chip is mounted directly on a substrate. In the COG type mounting structure, the input-side bumps of the liquid crystal driving ICs 103a and 103b are conductively connected to the metal wirings 114e and 114f, and the output-side bumps of the liquid crystal driving ICs 103a and 103b are conductively connected to the lead wirings 114c and 114d.

In FIG. 18, the FPC 104 includes a flexible resin film 123, a circuit 126 including chip parts 124, and metal wiring terminal 127. The circuit 126 is mounted directly on the surface of the resin film 123 by soldering or another conductive connection device. The metal wiring terminals 127 are made of an APC alloy, Cr, Cu, or another conductive material. The portion of the FPC 104 in which the metal wiring terminals 127 are formed is connected, with the ACF 122, to the portion of the first substrate 107a in which the metal wirings 114e and 114f are formed. The metal wirings 114e and 114f on the substrate side are connected to the metal wiring terminals 127 on the FPC side by the function of the conductive particles contained in the ACF 122.

Furthermore, an external connection terminal 131 is formed at the side of the FPC 104 opposite to the liquid panel side so that the external connection terminal 131 is connected to an external circuit not shown in the drawing. Therefore, the liquid crystal driving ICs 103a and 103b are driven based on the signal transmitted from the external circuit to supply a scanning signal to either of the first and second electrodes 114a and 114b, a data signal being supplied to the other electrodes. As a result, the voltage of each of the picture element pixels arranged in the dot matrix in the effective display area V is controlled for each pixel, and thus the orientation of the liquid crystal L is controlled for each picture element pixel.

In FIG. 18, the illumination device 106 functioning as the so-called back light includes a photoconductor 132 composed of an acrylic resin, a diffusion sheet 133 provided on the light emission plane 132b of the photoconductor 132, a reflecting sheet 134 provided on the plane of the photoconductor 132 opposite to the light emission plane 132b, and a LED (Light Emitting Diode) 136 serving as a light emission source, as shown in FIG. 19.

The LED 136 is supported by an LED substrate 137 which is mounted on a supporting member (not shown in the drawing), for example, which is formed integrally with the photoconductor 132. By mounting the LED substrate 137 at the predetermined position of the supporting member, the LED 136 is located at the position opposite to the light incidence plane 132a of the photoconductor 132, which is a side surface thereof. Reference numeral 138 denotes a buffer for buffering an impact applied to the liquid crystal panel 102.

When the LED 136 emits light, the light is incident on the light incidence plane 132a, introduced into the photoconductor 132, and transmitted therethrough while being reflected by the reflecting sheet 134 and the wall surfaces of the photoconductor 132. During transmittance, the light is emitted as planar light to the outside from the light emission plane 132b through the diffusion sheet 133.

In the liquid crystal device 101 of this embodiment having the above-described construction, therefore, with sufficiently bright external light such as sunlight, room light, or the like, the external light is introduced into the liquid crystal panel 102 from the second substrate 107b, transmitted through the liquid crystal L, and then reflected by the reflecting film 112 to be again supplied to the liquid crystal L. The orientation of the liquid crystal L is controlled for each of the picture element pixels of R, G and B by the electrodes 114a and 114b holding the liquid crystal L therebetween, and thus the light supplied to the liquid crystal L is modulated for each picture element pixel. By modulation, light transmitted through the polarizer plate 117b and light not transmitted through the polarizer plate 117b form an image such as a character, a numeric character, or the like on the outside of the liquid crystal panel 102. As a result, a reflective display is performed.

On the other hand, with an insufficient quantity of external light, light emitted from the LED 136 is emitted as planar light from the light emission plane 132b of the photoconductor 132, and the light is supplied to the liquid crystal L through the apertures 121 formed in the reflecting film 112. Like in the reflective display, in this case, the supplied light is modulated for each picture element pixel by the liquid crystal L with the controlled orientation, thereby displaying an image on the outside. As a result, a transmissive display is performed.

The liquid crystal device 101 having the above construction is manufactured by, for example, the manufacturing method shown in FIG. 17. In this manufacturing method, a series of steps from step P1 to step P6 are steps of forming the first substrate 107a, and a series of steps from step P11 to step P14 are steps of forming the second substrate 107b. The first substrate forming process and the second substrate forming process are separately carried out.

First, the first substrate forming process is described. The reflecting film 112 for a plurality of liquid crystal panels 102 is formed on the surface of a large-area mother raw material base made of light transmitting glass, light transmitting plastic, or the like by the photolithography method, and the insulating film 113 is formed on the reflecting film 112 by a known deposition method (Step P1). Next, the first electrodes 114a and the wirings 114c, 114d, 114e and 114f are formed by the photolithography process (Step P2).

Next, the alignment film 116a is formed on the first electrodes 114a by coating, printing, or the like (Step P3), and then the alignment film 116a is rubbed to determine the initial orientation of the liquid crystal (Step P4). Next, the sealing material 108 is circularly formed by, for example, screen printing or the like (Step P5), and then the spherical spacers 119 are dispersed on the sealing material 108 (Step P6). As a result, a large-area mother first substrate is formed, in which a plurality of panel patterns are formed on the first substrates 107a of the liquid crystal panels 102.

The second substrate forming process (Step P11 to Step P14 shown in FIG. 17) is carried separately from the first substrate forming process. First, a large-area mother raw material base made of light transmitting glass, light transmitting plastic, or the like is prepared, and the color filter 118 for a plurality of the liquid crystal panels 102 is formed on the surface of the mother raw material base (Step P11). The color filter is formed by the production method shown in FIG. 7, in which the filter elements of each of the R, G and B colors are formed by using the ink jet apparatus 16 shown in FIG. 9 according to any one of the methods of controlling an ink jet head shown in FIGS. 1, 2, 3, 4, and 5. The method of producing a color filter, and the method of controlling an ink jet head are the same as described above, and description thereof is thus omitted.

As shown in FIG. 7(*d*), the color filter 1, i.e., the color filter 118 is formed on the mother board 12, i.e., the mother raw material base. Then, the second electrodes 114b are formed by the photolithography process (Step P12), and the alignment film 116b is formed by coating, printing, or the like (Step P13). Then, the alignment film 116b is rubbed to determine the initial orientation of the liquid crystal (Step P14). As a result, a large-area mother second substrate is formed, in which a plurality of panel patterns are formed on the second substrates 107b of the liquid crystal panels 102.

After the large-area mother first and second substrates are formed as described above, both mother boards are aligned with each other with the sealing material 108 provided therebetween, and then bonded together (Step P21). As a result, an empty panel structure containing a panel portion for a plurality of liquid crystal panels is formed with no liquid crystal sealed therein.

Next, scribe grooves, i.e., cutting grooves, are formed at predetermined positions of the completed empty panel structure, and then the panel structure is broken, i.e., cut, based on the scribe grooves (Step P22). Consequently, a strip-like empty panel structure is formed, in which a liquid crystal inlet opening 110 (refer to FIG. 18) of the sealing material 108 of each of the liquid crystal panels is exposed to the outside.

Then, the liquid crystal L is injected into the liquid crystal panel through the exposed liquid crystal inlet opening 110, and then the liquid crystal inlet opening 110 is sealed with a resin or the like (Step P23). The liquid crystal is generally injected by, for example, a method in which a storage reservoir in which the liquid crystal is stored, and the strip-like empty panel are placed in a chamber, the strip-like empty panel is dipped in the liquid crystal in the chamber after the chamber is put into a vacuum state, and then the chamber is opened to the atmospheric pressure. At this time, the inside of the empty panel is in a vacuum state, and thus the liquid crystal pressurized by the atmospheric pressure is introduced into the panel through the liquid crystal inlet opening. Since the liquid crystal adheres to the surfaces of the liquid crystal panel structure after being injected in the panel structure, the strip-like panel is cleaned in Step P24 after the liquid crystal is injected.

Then, after injection of the liquid crystal and cleaning, scribe grooves are again formed at predetermined positions of the strip-like mother panel, and then the strip-like panel is cut based on the scribe grooves to be cut into a plurality of liquid crystal panels 102 (Step P25). Then, as shown in FIG. 18, the liquid crystal driving ICs 103a and 103b are mounted on each of the thus-produced liquid crystal panels 102, the illumination device 106 is mounted as a back light, and the FPC 104 is connected to the panel 102 to complete the intended liquid crystal device 101 (Step P26).

The above-described method and apparatus for manufacturing a liquid crystal device are characterized by, particularly, the step of producing the color filter as described below. Namely, an ink jet head having the structure shown in FIG. 1, 2, 3, 4 or 5 is used for discharging ink from the nozzle rows 28 of the plurality of heads 20 during main scanning of the substrate 12 with the carriage 25 serving as supporting means for supporting the plurality of heads 20. Therefore, the scanning time can be shortened as compared with the case of scanning of the surface of the substrate 12 with one head, thereby shortening the time required for producing a color filter.

Since main scanning is performed with the heads 20 each of which is inclined at an angle θ with the sub-scanning direction Y, the nozzle pitch of the plurality of nozzles 27 belonging to each of the heads 20 can be coincided with the distance between the filter element formation areas 7, i.e., the element pitch, on the substrate 12. When the nozzle pitch can be geometrically coincided with the element pitch, the positions of the nozzle rows 28 desirably need not be controlled in the sub-scanning direction Y Also, the entire carriage 25 is not inclined, but each of the heads 20 is inclined, the distance T between the nozzle closest to the substrate 12 and the nozzle 27 far from the substrate 12 is shorter than the case in which the entire carriage 25 is inclined, thereby shortening the scanning time of the substrate 12 with the ink jet head 22. Therefore, the time required for producing a color filter can be shortened.

In the method and apparatus for manufacturing a liquid crystal device of this embodiment, the filter elements 3 are formed by ink discharge from the ink jet head 22, thereby causing no need to pass through such a complicated process as the use of the photolithography process and no waste of materials.

Figure 20:
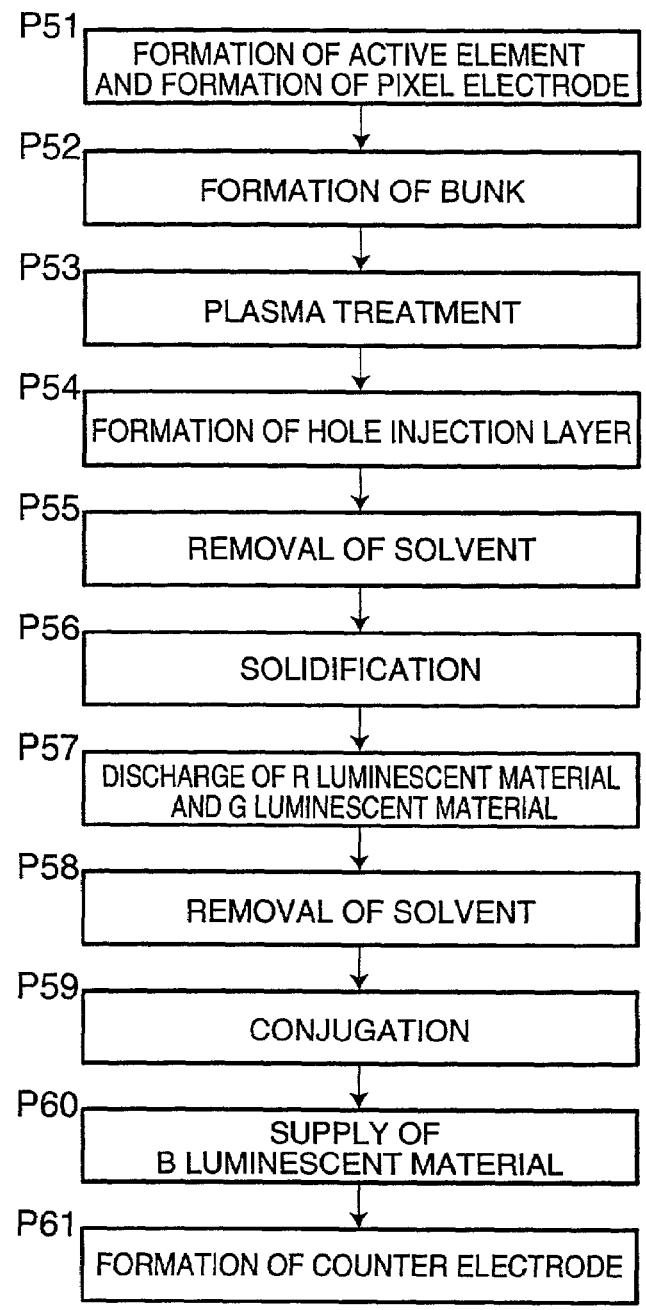
FIG. 20 is a drawing showing the steps of a method of manufacturing an EL device according to an embodiment of the present invention.
Figure 21:
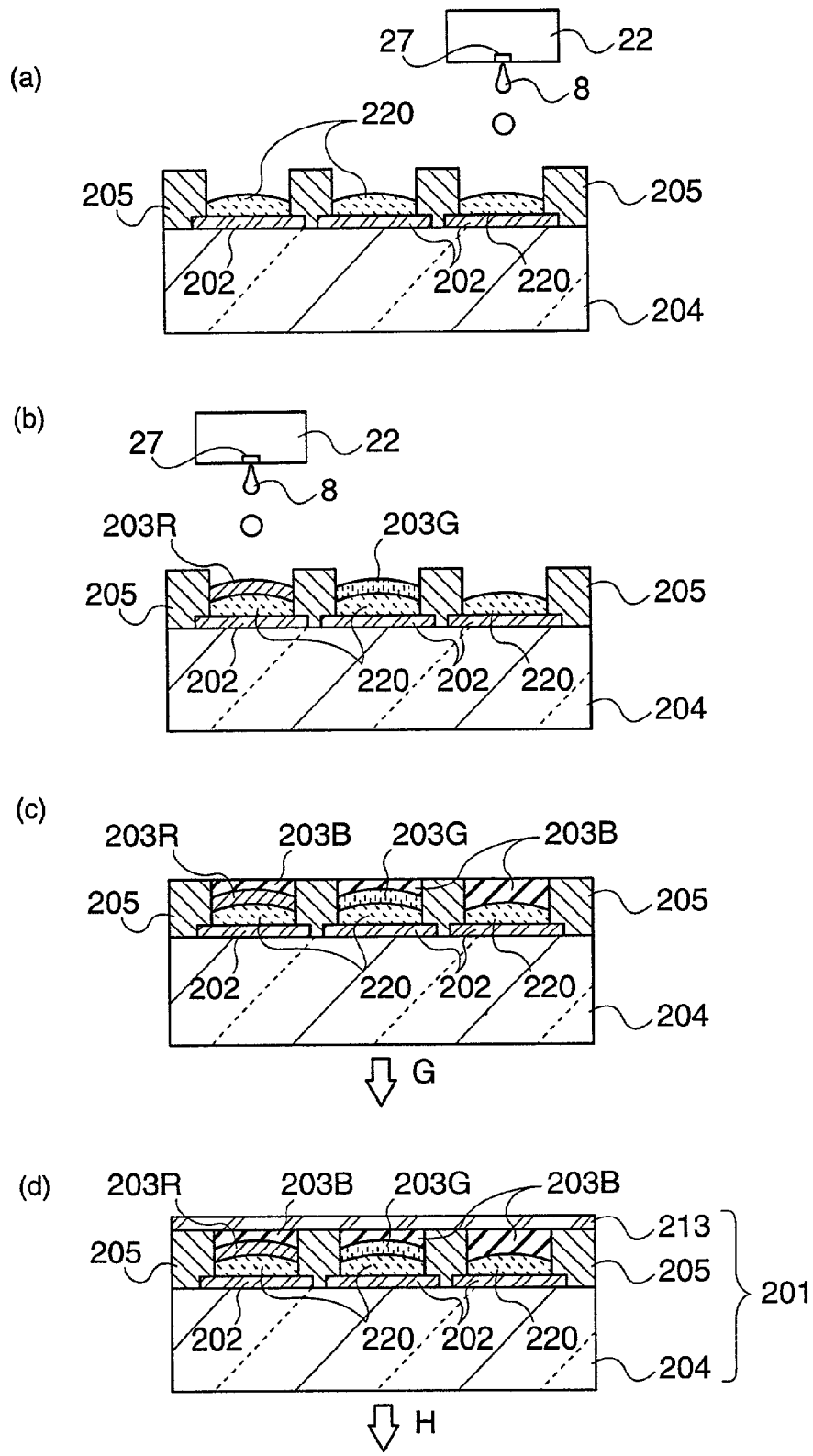
FIG. 21 is a sectional view of the EL device corresponding to the steps shown in FIG. 20.
Figure 22:
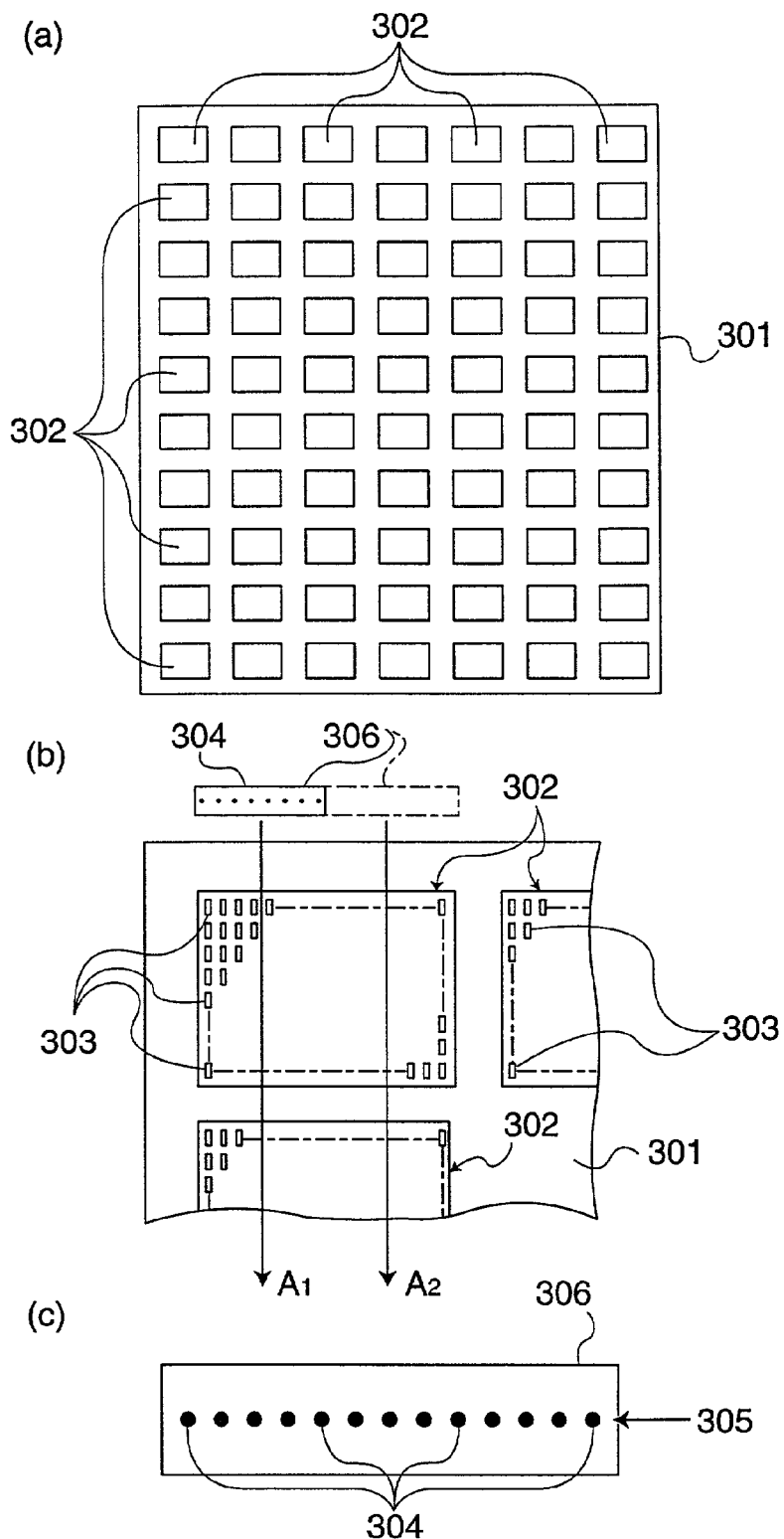
FIG. 22 is a drawing showing an example of a conventional method of producing a color filter.
Figure 23:
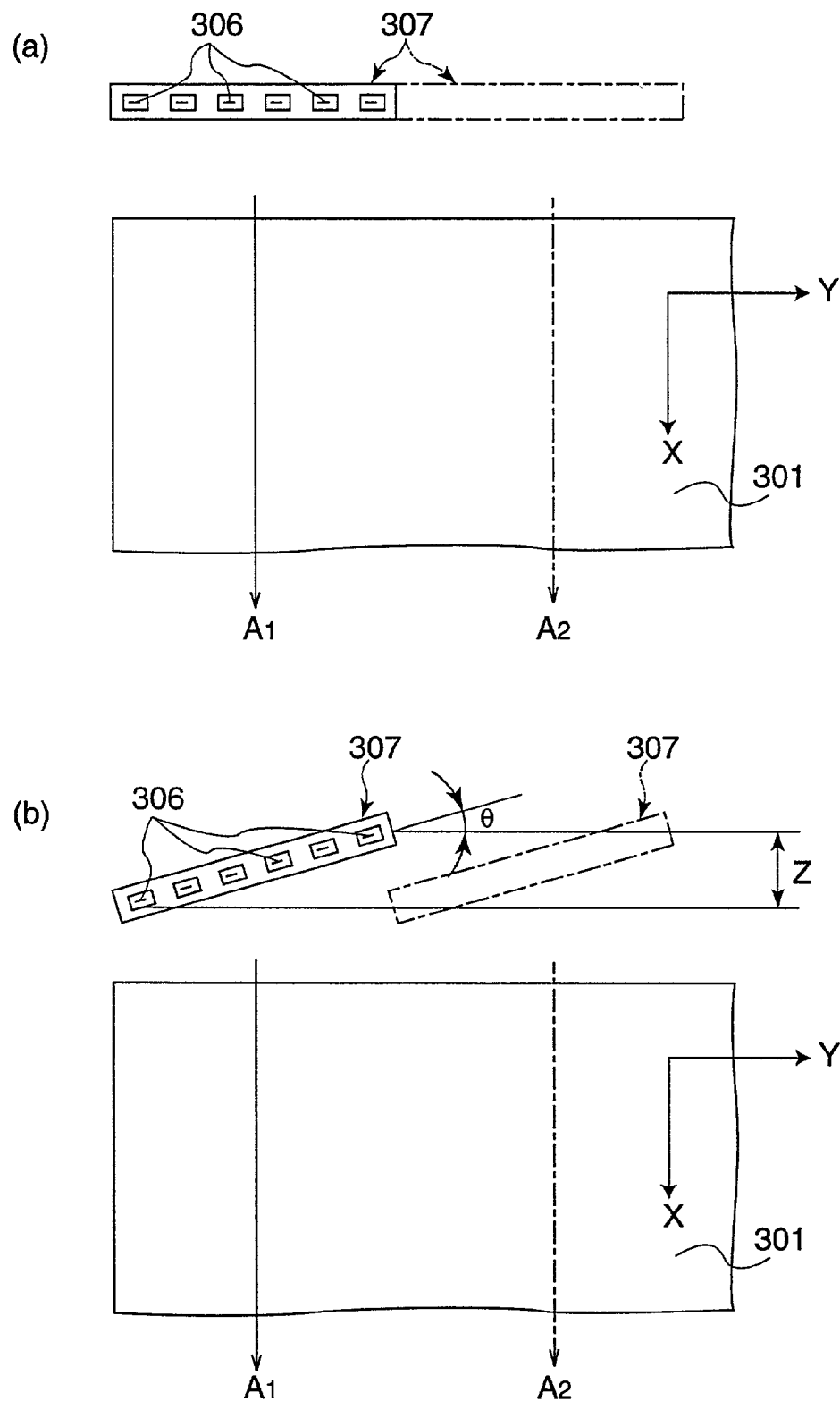
FIG. 23 is a drawing showing another example of a conventional method of producing a color filter.

FIG. 20 shows a manufacturing method using an apparatus for manufacturing an EL device according to an embodiment of the present invention. FIG. 21 shows the main steps of the manufacturing method and a main sectional structure of a finally resulted EL device. As shown in FIG. 21(d), an EL device 201 can include pixel electrodes 202 formed on a transparent substrate 204, a bank 205 formed in a lattice shape as viewed from the direction of arrow G to be located between the respective pixel electrodes 202, a hole injection layer 220 formed in the lattice-shaped recesses, a R color luminescent layer 203R, a G color luminescent layer 203G and a B color luminescent layer 203B which are formed in the lattice-shaped recesses in a predetermined arrangement such as a stripe arrangement as viewed from the direction of arrow G, and a counter electrode 213 formed on the luminescent layers.

When each of the pixel electrodes 202 is driven by a two-terminal active element, such as a TFD (Thin Film Diode) element or the like, the counter electrodes 213 are formed in stripes as viewed from the direction of arrow G. When each of the pixel electrodes 202 is driven by a three-terminal active element such as a TFT (Thin Film Transistor) element or the like, the counter electrodes 213 are formed as a single planar electrode.

The area held between each of the pixel electrodes 202 and each of the counter electrodes 213 serves as a picture element pixel, and a unit of the three picture element pixels of R, G and B colors forms a pixel. By controlling a current flowing through each of the picture element pixels, a desired pixel of the plurality of picture element pixels is selectively illuminated to display a desired full-color image in the direction of arrow H.

The EL device 201 is manufactured by, for example, the manufacturing method shown in FIG. 20.

Namely, in Step P51, as shown in FIG. 21(a), active elements such as TFD element, TFT elements, or the like are formed on the surface of the transparent substrate 204, and the pixel electrodes 202 are further formed. As the forming method, for example, a photolithography method, a vacuum deposition method, a sputtering method, a pyrosol method, or the like can be used. As the material of the pixel electrodes, ITO (Indium Tin Oxide), tin oxide, a compound oxide of indium oxide and zinc oxide, or the like can be used.

Next, in Step P52, as shown in FIG. 20(a), a partition, i.e., the bank 205, is formed by a puttering method, for example, a photolithography method, to fill the spaces between the respective transparent electrodes 202. This can improve contrast, and prevent color mixing of luminescent materials and light leakage from the spaces between the pixels. Although the material of the bank 205 is not limited as long as it has durability against a solvent of the EL materials, an organic material which can be fluorinated by fluorocarbon gas plasma treatment, for example, an acrylic resin, an epoxy resin, photosensitive polyimide, or the like is preferably used.

Next, the substrate 204 is continuously treated with oxygen gas plasma and fluorocarbon gas plasma immediately before ink for the hole injection layer is coated (Step P53). This treatment can make a polyimide surface water-repellant and an ITO surface hydrophilic, thereby controlling wettability of the substrate for finely patterning ink jet droplets. As the device for generating a plasma, either a device for generating a plasma in vacuum or a device for generating a plasma in the air may be used in a same manner.

Next, in Step P54, as shown in FIG. 21(a), the ink for the hole injection layer is discharged from the ink jet head 22 of the ink jet apparatus 16 shown in FIG. 9, and coated in a pattern on the pixel electrodes 202. Specifically, the ink jet head controlling method uses the method shown in FIG. 1, 2, 3, 4 or 5. After coating, the solvent is removed under a vacuum (1 torr) at room temperature for 20 minutes (Step P55), and then heat treatment is performed in the air at 20° C. (on a hot plate) for 10 minutes to form the hole injection layers 220 incompatible with ink for luminescent layers (Step P56). The thickness of the hole injection layers 220 is 40 nm.

Next, in Step P57, as shown in FIG. 21(b), ink for the R color luminescent layer and ink for the G color luminescent layer are coated on the hole injection layer in each of the filter element areas by using an ink jet process. In this process, the ink for each luminescent layer is discharged from the ink jet head 22 of the ink jet apparatus 16 shown in FIG. 9, and the ink jet controlling method is performed according to the method shown in FIG. 1, 2, 3, 4 or 5. The ink jet process can easily finely pattern ink within a short time. The thickness can be changed by changing the solid content of an ink composition and the discharge amount.

After coating of the inks for luminescent layers, the solvent is removed under a vacuum (1 torr) at room temperature for 20 minutes (Step P58), and then the inks are conjugated by heat treatment in a nitrogen atmosphere at 150° C. for 4 hours to form the R color luminescent layer 203R and the G color luminescent layer 203G (Step P59). The thickness of the luminescent layers is 50 nm. The luminescent layers conjugated by heat treatment are insoluble in a solvent.

The hole injection layer 220 may be continuously treated with oxygen gas plasma, and fluorocarbon gas plasma before the luminescent layers are formed. This can form a fluorinated layer on the hole injection layer 220 to increase the efficiency of hole injection due to an increase in ionization potential, thereby providing an organic EL device having a high efficiency of light emission.

Next, in Step P60, as shown in FIG. 21(c), the B color luminescent layer 203B is formed on the R color luminescent layer 203R, the G color luminescent layer 203G and the hole injection layer 220 in each of the picture element pixels. This can not only form the primary colors R, G and B, but also remove the steps between the R color luminescent layers 203R and the G color luminescent layers 203G, and the bank 205 to planarize the surface. Therefore, short-circuiting between the upper and lower electrodes can be securely prevented. By controlling the thickness of the B color luminescent layers 203B, the B color luminescent layers 203B function as electron injection transport layers in a laminated structure comprising the R color luminescent layers 203R and the G color luminescent layers 203G, thereby emitting no B color light.

As the method of forming the B color luminescent layers 203B as described above, for example, a general spin coating method as a wet method, or the same ink jet method as that for forming the R color luminescent layers 203R and the G color luminescent layers 203G can be used.

Then, in Step P61, as shown in FIG. 21(d), the counter electrodes 213 are formed to produce the intended EL device 201. When the counter electrodes 213 are formed as a planar electrode, the electrodes can be formed by a deposition method such as evaporation, sputtering, or the like using, for example, Mg, Ag, Al, Li, or the like as a material. When the counter electrodes 213 are formed as stripe electrodes, the electrodes can be formed by patterning a deposited electrode layer by photolithography or the like.

In the above-described method and apparatus for manufacturing an EL device, an ink jet head having the structure shown in FIG. 1, 2, 3, 4 or 5 is used for discharging ink from the nozzle rows 28 of the plurality of heads 20 during main scanning of the substrate 12 with the carriage 25 serving as supporting device that supports the plurality of heads 20. Therefore, the scanning time can be shortened as compared with the case of scanning of the surface of the substrate 12 with one head, thereby shortening the time required for producing an EL device.

Since main scanning is performed with the heads 20 each of which is inclined at an angle θ with the sub-scanning direction Y, the nozzle pitch of the plurality of nozzles 27 belonging to each of the heads 20 can be coincided with the distance between the EL picture element pixel formation areas 7, i.e., the element pitch, on the substrate 12. When the nozzle pitch can be geometrically coincided with the element pitch, the positions of the nozzle rows 28 desirably need not be controlled in the sub-scanning direction Y.

Also, the entire carriage 25 is not inclined, but each of the heads 20 is inclined, the distance T between the nozzle 27 closest to the substrate 12 and the nozzle 27 far from the substrate 12 is shorter than the case in which the entire carriage 25 is inclined, thereby shortening the scanning time of the substrate 12 with the ink jet head 22. Therefore, the time required for producing a EL device can be shortened. In the manufacturing method and apparatus of this embodiment, the picture element pixels 3 are formed by ink discharge from the ink jet head 22, thereby causing no need to pass through such a complicated process as the use of the photolithography process and no waste of materials.

Although the present invention is described above with reference to the preferred embodiments, it should be understood that the present invention is not limited to the embodiments, and various modifications can be made without departing from the spirit and scope of the present invention.

For example, in the above-described embodiments, six heads 20 are provided in the ink jet head 22 as shown in FIG. 1, the number of the heads 20 can be decreased or increased.

In the embodiment shown in FIG. 1, plural lines of the color filter formation areas 11 are set on the mother board 12, however, the present invention can be applied to the case in which one line of the color filter formation areas 11 is formed on the mother board 12. Also, the present invention can be applied to the case in which only one color filter formation area 11, whose size is substantially the same as or extremely smaller than the mother board 12, is set on the mother board 12.

In the apparatus producing a color filter shown in FIGS. 9 and 10, the ink jet head 22 is moved in the X direction to perform main scanning of the substrate 12, and the substrate 12 is moved in the Y direction by the sub-scanning driving device 21 to perform sub-scanning of the substrate 12 with the ink jet head 22. However, in contrast, the substrate 12 may be moved in the Y direction to execute main scanning, and the ink jet head 22 may be moved in the X direction to execute sub-scanning.

Although each of the above-described embodiments uses an ink jet head having a structure in which ink is discharged by utilizing deflection of a piezoelectric element, an ink jet head having any desired structure can be used.

Although each of the above-described embodiments has a general construction in which the main scanning direction is perpendicular to the sub-scanning direction as an example, the relation between the main scanning direction and the sub-scanning direction is not limited to the perpendicular relation, and both directions may cross each other at any desired angle.

As the material to be discharged, various materials can be selected according to the elements formed on an object such as a substrate or the like. Besides the above-described ink and EL luminescent materials, for example, a silica glass precursor, a conductive material such as a metal compound, a dielectric material, or a semiconductor material may be used.

Although the above embodiments relate to the method and apparatus for producing a color filter, the method and apparatus for manufacturing a liquid crystal device, and the method and apparatus for manufacturing an EL device as examples, it should be understood that the present invention is not limited to these examples, and can be used for all industrial techniques for finely patterning an object.

Examples of applications can include the formation of various semiconductor devices (thin film transistors, thin film diodes, etc.), various wiring patterns, and insulating films, etc.

As the material to be discharged from a head, various materials can be selected according to the elements formed on an object such as a substrate or the like. Besides the above-described ink and EL luminescent materials, for example, a silica glass precursor, a conductive material such as a metal compound, a dielectric material, or a semiconductor material may be used.

Although, in the above-described embodiments, the head is referred to as an "ink jet head" for the sake of convenience, the material to be discharged from the ink jet head is not limited to ink. Examples of the material to be discharged include the EL luminescent materials, a silica glass precursor, a conductive material such as a metal compound, a dielectric material, a semiconductor material, and the like. The liquid crystal device and EL device manufactured by the manufacturing method and apparatuses of the above embodiments can be mounted on the display sections of electronic devices, for example, a cellular phone, a portable computer, etc.

In a color filter, a liquid crystal device, an EL device and apparatuses and methods for producing these devices of the present invention, ink is discharged from a plurality of heads during main scanning of a substrate with the plurality of heads. Therefore, the scanning time can be shortened as compared with the case of scanning of the surface of the substrate with one head.

Since main scanning is performed with the heads each of which is inclined, the nozzle pitch of the plurality of nozzles belonging to each of the heads can be coincided with the element pitch of filter elements or picture element pixels formed on the substrate.

Furthermore, since not the entire supporting mechanism for supporting the plurality of heads is inclined, but each of the heads is inclined, the distance between the nozzle closest to the substrate and the nozzle far from the substrate is shorter than the case in which the entire supporting device is inclined, thereby shortening the scanning time of the substrate with the supporting mechanism. Therefore, the time required for producing a color filter, a liquid crystal device, or a EL device can be shortened.

While this invention has been described in conjunction with the specific embodiments thereof, it is evident that many alternatives, modifications and variations will be apparent to those skilled in the art. Accordingly, preferred embodiments of the invention as set forth herein are intended to be illustrative, not limiting. There are changes that may be made without departing from the spirit and scope of the invention.

What is claimed is:

1. An apparatus for discharging a material to an object, comprising:
   an ink jet head that contains a plurality of heads, each having a nozzle row, the nozzle row having an arrangement of a plurality of nozzles;
   a supporting mechanism that supports the plurality of heads;
   a mechanism that scans at least one of the object and the supporting mechanism relative to each other in a scanning direction; and
   a control device that moves the ink jet head, the control device including at least a first motor for oscillating and rotating the ink jet head around an axis parallel to the scanning direction, a second motor for oscillating and rotating the ink jet head around an axis parallel to a sub-scanning direction that is perpendicular to the scanning direction, and a third motor for moving the ink jet head orthogonal to the plane defined by the scanning direction and the sub-scanning direction,
   wherein the nozzle row is inclined relative to the scanning direction.

2. An apparatus for discharging a material according to claim 1, the plurality of the heads being supported obliquely relative to a longitudinal direction of the supporting mechanism.

3. An apparatus for discharging a material according to claim 1, at least one of the object and the supporting mechanism being scanned relative to the other in at least one of a main scanning direction and a sub-scanning direction crossing the main scanning direction.

4. An apparatus for discharging a material according to claim 1, the plurality of the heads having substantially a same nozzle pitch of the nozzle rows, and substantially a same inclination angle of the nozzle rows.

5. An apparatus for producing a color filter comprising a discharging apparatus according to claim 1,
   a color filter material being the material that is discharged to a substrate serving as the object.

6. An apparatus for manufacturing an EL device comprising a discharging apparatus according to claim 1,
   an EL luminescent material being the material that is discharged to a substrate serving as the object.

7. An apparatus for discharging a material to an object, comprising:
   an ink jet head that contains a plurality of heads, each having a nozzle row, the nozzle row having an arrangement of a plurality of nozzles;
   a supporting mechanism that supports the plurality of the heads;
   a mechanism that scans at least one of the object and the supporting mechanism relative to each other;

a control device that moves the ink jet head, the control device including at least a first motor for oscillating and rotating the ink jet head around an axis parallel to the scanning direction, a second motor for oscillating and rotating the ink jet head around an axis parallel to a sub-scanning direction that is perpendicular to the scanning direction, and a third motor for moving the ink jet head orthogonal to the plane defined by the scanning direction and the sub-scanning direction; and a mechanism that controls an angle formed by at least one of the nozzle rows and the scanning direction.

8. An apparatus for discharging a material according to claim 7, further comprising:

a mechanism for controlling a spacing between the plurality of the nozzle rows.

9. An apparatus for discharging a material according to claim 7, the mechanism that controls the angle between at least one nozzle row and the scanning direction controlling the angle in such a manner that the plurality of the heads have substantially the same nozzle pitch of the nozzle rows and substantially the same inclination angle of the nozzle rows.

10. An apparatus for producing a color filter, comprising:

an ink jet head that contains a plurality of heads, each having a nozzle row, the nozzle row including an arrangement of a plurality of nozzles;

a control device that moves the ink jet head, the control device including at least a first motor for oscillating and rotating the ink jet head around an axis parallel to the scanning direction, a second motor for oscillating and rotating the ink jet head around an axis parallel to a sub-scanning direction that is perpendicular to the scanning direction, and a third motor for moving the ink jet head orthogonal to the plane defined by the scanning direction and the sub-scanning direction;

a mechanism that supplies a filter material to the heads; and a supporting mechanism that supports the plurality of the heads, wherein the supporting mechanism supports the plurality of the heads in an inclined state.

11. An apparatus for producing a color filter according to claim 10, the supporting mechanism supporting the heads in a fixed state.

12. An apparatus for producing a color filter according to claim 10, the plurality of the heads having substantially a same nozzle pitch of the nozzle rows, and substantially a same inclination angle of the nozzle rows.

13. An apparatus for producing a color filter, comprising:

an ink jet head that contains a plurality of heads, each having a nozzle row, the nozzle row including an arrangement of a plurality of nozzles;

a mechanism that supplies a filter material to the heads;

a supporting mechanism that supports the plurality of the heads;

a main scanning mechanism that moves the supporting mechanism by main scanning;

a sub-scanning mechanism that moves the supporting mechanism by sub-scanning;

a control device that moves the ink jet head, the control device including at least a first motor for oscillating and rotating the ink jet head around an axis parallel to the scanning direction, a second motor for oscillating and rotating the ink jet head around an axis parallel to a sub-scanning direction that is perpendicular to the scanning direction, and a third motor for moving the ink jet head orthogonal to the plane defined by the scanning direction and the sub-scanning direction;

a nozzle row angle control mechanism that controls the inclination angles of the plurality of the nozzle rows; and a nozzle row spacing control mechanism that controls a spacing between the plurality of the nozzle rows.

14. An apparatus for producing a color filter according to claim 13, the plurality of the heads having substantially a same nozzle pitch and substantially a same inclination angle of the nozzle rows.

15. An apparatus for manufacturing a liquid crystal device, comprising:

an ink jet head that contains a plurality of heads, each having a nozzle row, the nozzle row including an arrangement of a plurality of nozzles;

a control device that moves the ink jet head, the control device including at least a first motor for oscillating and rotating the ink jet head around an axis parallel to the scanning direction, a second motor for oscillating and rotating the ink jet head around an axis parallel to a sub-scanning direction that is perpendicular to the scanning direction, and a third motor for moving the ink jet head orthogonal to the plane defined by the scanning direction and the sub-scanning direction;

a mechanism that supplies a filter material to the heads;

a supporting mechanism that supports the plurality of the heads;

a main scanning mechanism that moves the supporting mechanism by main scanning; and a sub-scanning mechanism that moves the supporting mechanism by sub-scanning, wherein the supporting mechanism supports the plurality of the heads in an inclined state.

16. An apparatus for manufacturing an EL device, comprising:

an ink jet head that contains a plurality of heads, each having a nozzle row, the nozzle row having an arrangement of a plurality of nozzles;

a control device that moves the ink jet head, the control device including at least a first motor for oscillating and rotating the ink jet head around an axis parallel to the scanning direction, a second motor for oscillating and rotating the ink jet head around an axis parallel to a sub-scanning direction that is perpendicular to the scanning direction, and a third motor for moving the ink jet head orthogonal to the plane defined by the scanning direction and the sub-scanning direction;

a mechanism that supplies an EL luminescent material to the heads;

a supporting mechanism that supports the plurality of the heads;

a main scanning mechanism that moves the supporting mechanism by main scanning;

a sub-scanning mechanism that moves the supporting mechanism by sub-scanning;

a nozzle row angle control mechanism that controls the inclination angles of the plurality of the nozzle rows; and a nozzle row distance control mechanism that controls a spacing between the plurality of the nozzle rows.

* * * * *